(12) United States Patent
Hanzawa et al.

(10) Patent No.: US 8,730,717 B2
(45) Date of Patent: May 20, 2014

(54) SEMICONDUCTOR DEVICE

(75) Inventors: Satoru Hanzawa, Hachioji (JP);
Yoshitaka Sasago, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 261 days.

(21) Appl. No.: 13/104,005

(22) Filed: May 9, 2011

(65) Prior Publication Data

US 2011/0273927 A1 Nov. 10, 2011

(30) Foreign Application Priority Data

May 10, 2010 (JP) .................................. 2010-107959

(51) Int. Cl.
*G11C 11/00* (2006.01)

(52) U.S. Cl.
USPC ............................ 365/163; 365/148; 365/100

(58) Field of Classification Search
USPC ......................................... 365/163, 148, 100
See application file for complete search history.

(56) References Cited

U.S. PATENT DOCUMENTS

| | | | |
|---|---|---|---|
| 7,423,910 B2 | 9/2008 | Umezawa | |
| 7,687,840 B2 | 3/2010 | Shinmura | |
| 7,778,063 B2 * | 8/2010 | Brubaker et al. | 365/148 |
| 8,169,819 B2 * | 5/2012 | Shima et al. | 365/163 |
| 8,331,152 B2 * | 12/2012 | Yoon et al. | 365/185.11 |
| 2004/0174732 A1 | 9/2004 | Morimoto | |
| 2005/0045919 A1 | 3/2005 | Kaeriyama et al. | |
| 2007/0252201 A1 | 11/2007 | Kito et al. | |
| 2008/0149913 A1 | 6/2008 | Tanaka et al. | |
| 2013/0121076 A1 | 5/2013 | Maejima | |

FOREIGN PATENT DOCUMENTS

| | | |
|---|---|---|
| JP | 2004-272975 A | 9/2004 |
| JP | 2005-353779 A | 12/2005 |
| JP | 2006-331501 A | 12/2006 |
| JP | 2007-266143 A | 10/2007 |
| JP | 2008-160004 A | 7/2008 |
| JP | 2009-124175 A | 6/2009 |
| JP | 2009-266946 A | 11/2009 |

OTHER PUBLICATIONS

Kwang-Jin Lee et al., "A 90nm 1.8V 512Mb Diode-Switch PRAM with 266MB/s Read Throughput", IEEE International Solid-State Circuits Conference, (US) 2007, pp. 472-473.
Stefan Lai et al., "OUM—A 180 nm Nonvolatile Memory Cell Element Technology for Stand Alone and Embedded Applications", IEEE International Electron Devices Meeting, Technical Digest, (US) 2001, pp. 803-806.

* cited by examiner

*Primary Examiner* — Son Dinh
*Assistant Examiner* — Nam Nguyen
(74) *Attorney, Agent, or Firm* — Miles & Stockbridge P.C.

(57) ABSTRACT

A semiconductor device has multiple memory cell groups arranged at intersections between multiple word lines and multiple bit lines intersecting the word lines. The memory cell groups each have first and second memory cells connected in series. Each of the first and the second memory cells has a select transistor and a resistive storage device connected in parallel. The gate electrode of the select transistor in the first memory cell is connected with a first gate line, and the gate electrode of the select transistor in the second memory cell is connected to a second gate line. A first circuit block for driving the word lines (word driver group WDBK) is arranged between a second circuit block for driving the first and second gate lines (phase-change-type chain cell control circuit PCCCTL) and multiple memory cell groups (memory cell array MA).

10 Claims, 20 Drawing Sheets

X: WORD LINE DIRECTION

Y: BIT LINE DIRECTION

SEMICONDUCTOR DEVICE

CLAIM OF PRIORITY

The present application claims priority from Japanese patent application JP 2010-107959 filed on May 10, 2010, the content of which is hereby incorporated by reference into this application.

FIELD OF THE INVENTION

The present invention concerns a semiconductor device and it relates to a technique which is effective when applied to a storage device including a memory cell including a device causing difference in a resistance value corresponding to stored information and, particularly, it relates to a storage device including a phase change memory using memory cells that store information by utilizing the change of state of a chalcogenide material and discriminating information by detecting the difference of a resistance value depending on the information.

BACKGROUND OF THE INVENTION

In the technique investigated by the present inventors, the following techniques may be considered, for example, in a semiconductor device having a phase change memory. The storage device uses chalcogenide materials such as Ge—Sb—Te system and an Ag—In—Sb—Te system at least containing antimony (Sb) and tellurium (Te) (or phase change material) as the material for a storage layer. Further, a diode is used as a selection device. Information is stored by controlling the crystal state of the chalcogenide material by Joule heat. The stored information is read out by detecting the resistance value which is different between an amorphous state and a crystalline state by a current. The resistance is high in the amorphous state and resistance is low in the crystalline state. The device characteristic of the phase change memory using the chalcogenide material and the diode described above are described for example, in IEEE International Solid-State Circuits Conference, Digest of Technical papers, FIG. 26.1.5 in USA. Further, when the structure of the resistance device is made smaller in the phase change memory, electric power necessary for the change of state of a phase change film is decreased as described in IEEE International Electron Devices meeting, Technical Digest, (US) 2001, pp. 803-806, FIG. 7. Accordingly, the phase change memory is suitable to refinement in view of the principle and studies therefor have been conducted vigorously.

As a method of making the integration degree higher in the memory utilizing such resistance change type devices, Japanese Unexamined Patent Publication No. 2004-272975 and Japanese Unexamined Patent Publication No. 2009-124175 disclose a serial/parallel type memory cell array in which multiple memory cells each having a transistor as a selection device and a resistance change type device connected in parallel are connected in series. This is a memory cell array configuration capable of obtaining a cell area of $4F^2$ physical area to the minimum of feature size F, which is a structure suitable for high integration. Further, Japanese Unexamined Patent Publication No. 2008-160004 describes a structure in which the serial-parallel type memory cell array is formed in a direction vertical to a silicon substrate. By stacking memory cells, increase in the capacitance is further progressed.

Documents relevant to the present invention include IEEE International Solid-State Circuits Conference, Digest of Technical papers. The document discloses a method of manufacturing an NAND type flash memory with a less number of steps per layer by depositing gate electrode materials and insulating films each in plurality, forming multiple holes penetrating all layers by collective fabrication in the stacked structure and depositing and fabricating a charge trap layer containing a silicon nitride film, a tunnel insulating film, and polysilicon as a channel inside the holes.

SUMMARY OF THE INVENTION

Prior to the filing of the present application, the present inventors have studied further on the high integration of a stacked type phase change memory cell as described in FIG. 1 to FIG. 3 of Japanese Unexamined Patent Publication No. 2008-160004. As a result, it has been found that the region that forms one-bit memory cell is decreased by separating word lines or patterning a gate electrode film. However, while the size of the memory cell per se is decreased, the number of control lines used for memory cell selection is increased. Accordingly, it has been found that other regions than the memory cell array are enlarged depending on the method of arranging the circuit for driving each of control lines which may possibly lower the integration degree.

Then, further studies have been made on the method of arranging control line driving circuits. In this process, it has been noted particularly, among various known techniques, on a non-volatile semiconductor storage device 1 described in FIG. 1 of Japanese Unexamined Patent Publication No. 2007-266143. The storage device has a feature of having multiple memory strings each having multiple electrically rewritable memory cells which are stacked and connected in series in a direction vertical to a silicon substrate. A circuit block including multiple memory strings is referred to as a memory transistor region 2. In addition, the device has a word line driving circuit 3, source-side select gate line (SGS) driving circuits 4, drain side-select gate line (SGD) driving circuits 5, a sense amplifier 6, etc. The memory transistor forming the memory transistor region 2 is formed by stacking multiple semiconductor layers, and the memory transistor region 2 has a rectangular solid shape. In the following description, in order to make the explanation simpler for the positional relation between each of the driving circuits, four sides of the rectangular shape as the bottom shape of the memory transistor region 2 are referred to as the first side to the fourth side in the clockwise direction, and the respective positions of the driving circuits arranged at the periphery of the memory transistor region 2 are referred to as the region adjacent to the first side to the region adjacent to the fourth side.

At first, a word line for each of the layers has a plate-like planar structure extending in a 2-dimensional manner for a certain region and has a planar structure each including an identical layer. A word line driving circuit 3 for controlling the word lines is arranged in a region adjacent to the first side. Then, source-side select gate lines (SGS) having a plate-like planar wiring interconnect structure, and a source-side select gate line (SGS) driving circuit 4 is arranged in a region adjacent to the third side. Further, drain-side select gate lines (SGD) having an interconnect structure insulatingly separated from each other and a drain side select gate line (SGD) driving circuit 5 is arranged in a region adjacent with the third side and outside of the source-side the select gate line (SGS) driving circuit 4. Further, a bit line formed above the memory string is formed in a direction of connecting the second side and the fourth side, and a sense amplifier 6 is arranged in a region adjacent to the second side.

When the method of arranging the driving circuits has been studied in detail, it has been found that loss may be caused in the layout area in view of the following two points. At first, the source-side select gate (SGS) driving circuit 4 and the drain-side select gate line (SGD) driving circuits 5 are arranged in a direction perpendicular to the third side. Since the drain-side select gate line (SGD) can be formed at a pitch twice as large as the minimum of feature size F, the drain-side select gate line (SGD) driving circuit 5 is arranged in a group. Then, the regularity in the layout of a non-volatile semiconductor storage device 1 is kept by arranging the source-side select gate line (SGS) driving circuit 4 between the drain-side select gate line (SGD) driving circuit 5 and the memory transistor region 2. However, since the source-side select gate lines (SGS) are in a plate-like planar structure as described above, one source-side select gate line (SGS) driving circuit may suffice. Accordingly, the source-side select gate line (SGS) driving circuit 4 can be formed within a range much shorter than the length of the third side. Therefore, the remaining region may possibly be a useless region.

Secondly, the word line driving circuit 3 is arranged alone in a region adjacent to the first side. Since the word line also has a plate-like planar structure as described above, the word line driving circuit 3 can be formed within a range shorter than the length of the first side if the number of stackings of the memory cells is less than the number of the drain-side select gate lines. Therefore, the remaining range may possibly be a useless region. Accordingly, upon higher integration of the stacked type phase change memory cell, it is possible to arrange the driving circuits more efficiently.

Then, in view of the problems described above, the present invention intends to provide a method of arranging various control line driving circuits in a stacked type phase change memory such that the ratio of the bottom area of the memory array occupying the chip area is increased as much as possible. The foregoing purpose and the novel feature of the invention will become apparent by reading the descriptions of the present specification in conjunction with the appended drawings.

The outline of typical inventions among those disclosed in the present application is simply explained as below. In a semiconductor device (for example, in FIG. 1 for a first embodiment), multiple memory cell groups are arranged each at an intersection between multiple word lines and multiple bit lines intersecting the word lines. The word lines are formed at a pitch twice as large as the minimum of feature size F. The memory cell groups each have first and second memory cells connected in series. Further, each of the first and second memory cells has a select transistor and a resistive storage device, and the select transistor and the resistive storage device are connected in parallel. Further, a gate electrode of the select transistor in the first memory cell is connected with a first gate line, and a gate electrode of the select transistor in the second memory cell is connected with a second gate line. Then, the first and second circuit blocks can be arranged efficiently by arranging the first circuit block that drives the plurality of word lines between the second circuit block that drives the first and second gate lines, and the plurality of memory cell groups.

Further, in another semiconductor device (for example, FIG. 9 for the first embodiment), when the plurality of memory cell groups each positioned above a diode and the first and second memory cells, the plurality of the word lines are driven to a first voltage (=VSS) in the first state (=standby state), and the plurality of the bit lines are driven to a first voltage (=VSS) in the first state (=standby state). Then, when a first operation is started, the plurality of bit lines are driven to a second voltage (=VDH) after one of the first and second memory cells is selected, and the diode in the plurality of memory cell groups is put to a second state (=reverse bias state). Further, when a first bit line among the plurality of bit lines which is driven to the second voltage (=VDH) is driven at the first voltage (=VSS), and the first word line among the plurality of word lines which is driven to the second voltage (=VDH) is driven at the second voltage (=VDH), the diode in the memory cell group arranged at the intersection between the first bit line and the first word line is put to a third state (=forward bias state).

In a further semiconductor device (for example, in FIG. 13, FIG. 16 for a fourth embodiment), multiple memory tiles are arranged each at an intersection between multiple global word lines and multiple global bit lines intersecting the global word lines. In each of the memory tiles, multiple memory cell groups are arranged each at an intersection between multiple word lines and multiple bit lines intersecting therewith. Then, each of the memory cell groups has first and second memory cells connected in series. Further, each of the memory tiles has a first circuit block that drives word lines, and the first circuit block is arranged at the periphery of the memory cell groups. Further, each of the memory tiles is arranged in such a direction that the first circuit block is in contact therewith.

Referring briefly to the effect obtained by typical inventions among those disclosed in the present application, a phase change memory at high integration degree by using a chalcogenide material can be attained.

DETAILED DESCRIPTION OF THE PREFERRED EMBODIMENTS

Figure 1:
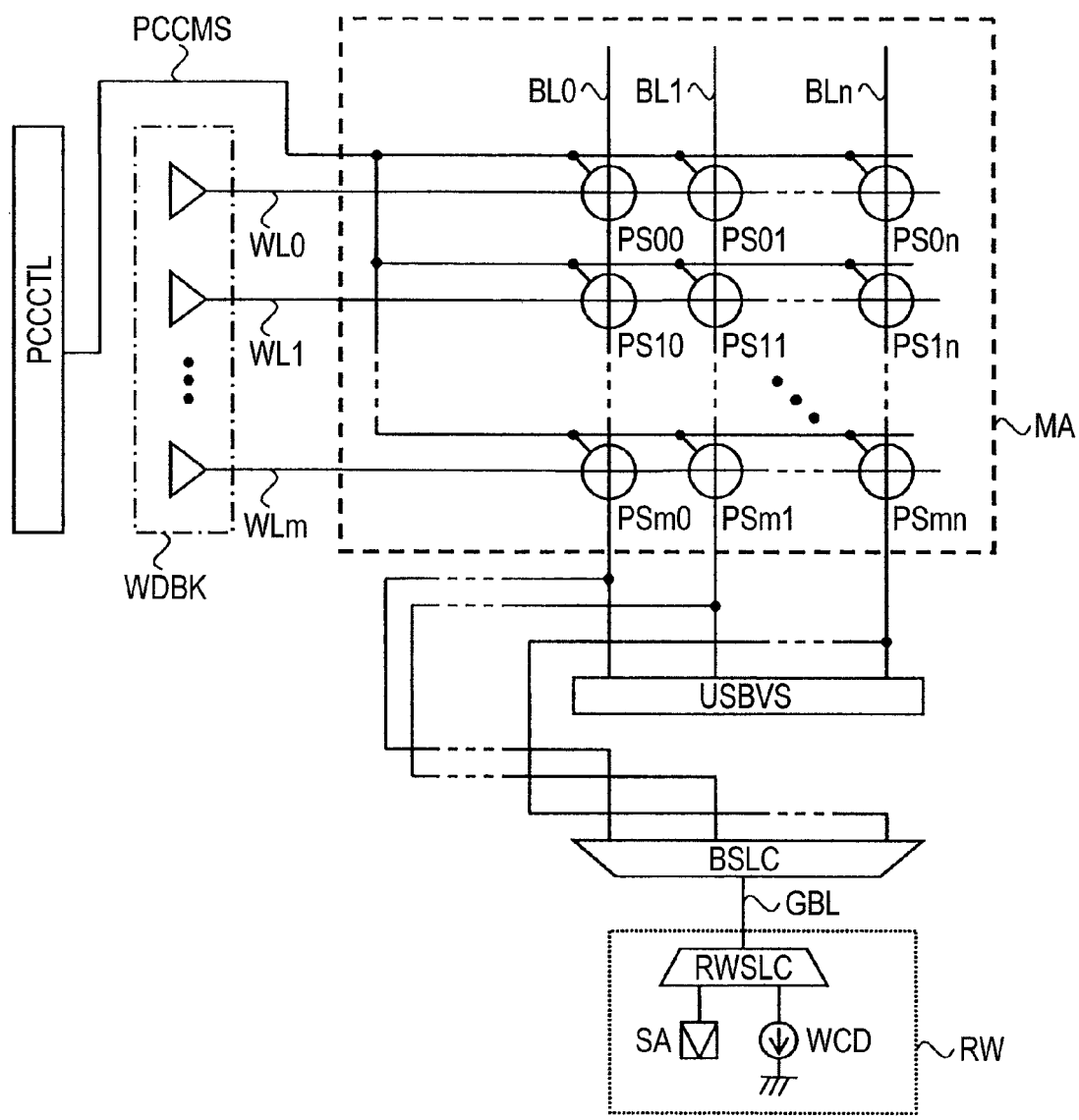
FIG. 1 is a view showing a configurational example of a memory cell array circuit of a phase change memory in a semiconductor device of a first embodiment according to the present invention.

Preferred embodiments of the invention are to be described in details with reference to the drawings. Throughout the drawings for explaining the preferred embodiments, identical members carry the same reference numerals, in general, for which duplicate descriptions are to be omitted. Further, circuit devices constituting each of the memory cells in the preferred embodiments are not particularly restricted and they are formed on a semiconductor substrate formed of single crystal silicon, etc. by a known integrated circuit technique such as CMOS (Complementary MOS Transistor). Further, the memory cell uses a phase change memory or a resistive storage device such as RERAM (Resistive Random Access Memory), MRAM (Magnetoresistive Random Access memory), etc. Particularly, the structure in a case of using the phase change memory is typically described in Japanese Unexamined Patent Publication No. 2007-266143.

First Embodiment

A preferred embodiment is to be described with reference to an example of a configuration of a memory cell array in which phase-change-type strings each having a diode and a pair of phase-change-type chain cells are arranged in a matrix. The phase-change-type chain cell has a configuration in which multiple memory cells are stacked in a direction vertical to a silicon substrate and, further, a transistor for selecting one of phase-change-type chain cells is connected in series therewith. Further, the memory cell has a configuration in which a select transistor and a phase change device are connected in parallel. Then, the circuit configuration and the structure of the memory cell array are to be described and then the method of arranging various control lines and driving circuits and the operation of the memory cell array are to be described in detail.

<<Circuit Configuration of Memory Cell Array>>

FIG. 1 shows a memory cell array circuit according to this embodiment. A memory cell array MA includes phase-change-type strings PS00 to PSmn arranged in rows by the number of m and columns by the number of n. Each of the phase-change-type strings PS00 to PSmn are arranged each at an intersection between word lines WL0 to WLm by the number of (m+1) and bit lines BL0 to BLn by the number of (n+1). Further, the phase-change-type strings PS00 to PSmn are controlled by phase change chain cell control signal group PCCMS. The phase-change-type chain cell control signal group PCCMS is in a comb-like interconnect structure. The teeth are formed in parallel with the word lines WL0 to WLm respectively.

The word lines WL0 to WLm are driven by a word driver group WDBK. Further, the phase-change-type chain cell control signal group PCCMS is driven by a phase-change-type chain cell control circuit PCCCTL. The word driver group WDBK is arranged between the phase-change-type chain cell control circuit PCCCTL and the memory cell array MA.

A bit line select circuit BSLC and a non-select bit line voltage supply circuit USBVS are connected respectively to the bit lines BL0 to BLn. The bit line select circuit BSLC (on one side) selects optional one of bit lines BL0 to BLn to electrically connect the same with a global bit line GBL. A read/write circuit RW is arranged to the global bit line GBL. The read/write circuit RW has a sense amplifier SA, a write circuit WCD, and a read/write select circuit RWSLC. Read/write operation for stored information is performed by electrically connecting one of the sense amplifier SA and the writing circuit WCD by way of the read/write select circuit RWSLC to the global bit line GBL. The non-select bit line voltage supply circuit USBVS is further connected with the bit lines BL0 to BLn. The non-select bit line voltage supply circuit USBVS supplies a non-select voltage to the entire bit lines in a standby state and to the bit lines by the number of n excluding the selected bit line in the read/write operation. While details are to be described in the explanation for the operation of the memory cell array, the voltage supply mechanism can avoid erroneous writing to other memory cells than those selected. The non-selection bit line voltage supply circuit USBVS is arranged between the bit line select circuit BSLC and the memory cell array MA.

<<Structure of Memory Cell Array>>

Figure 2:
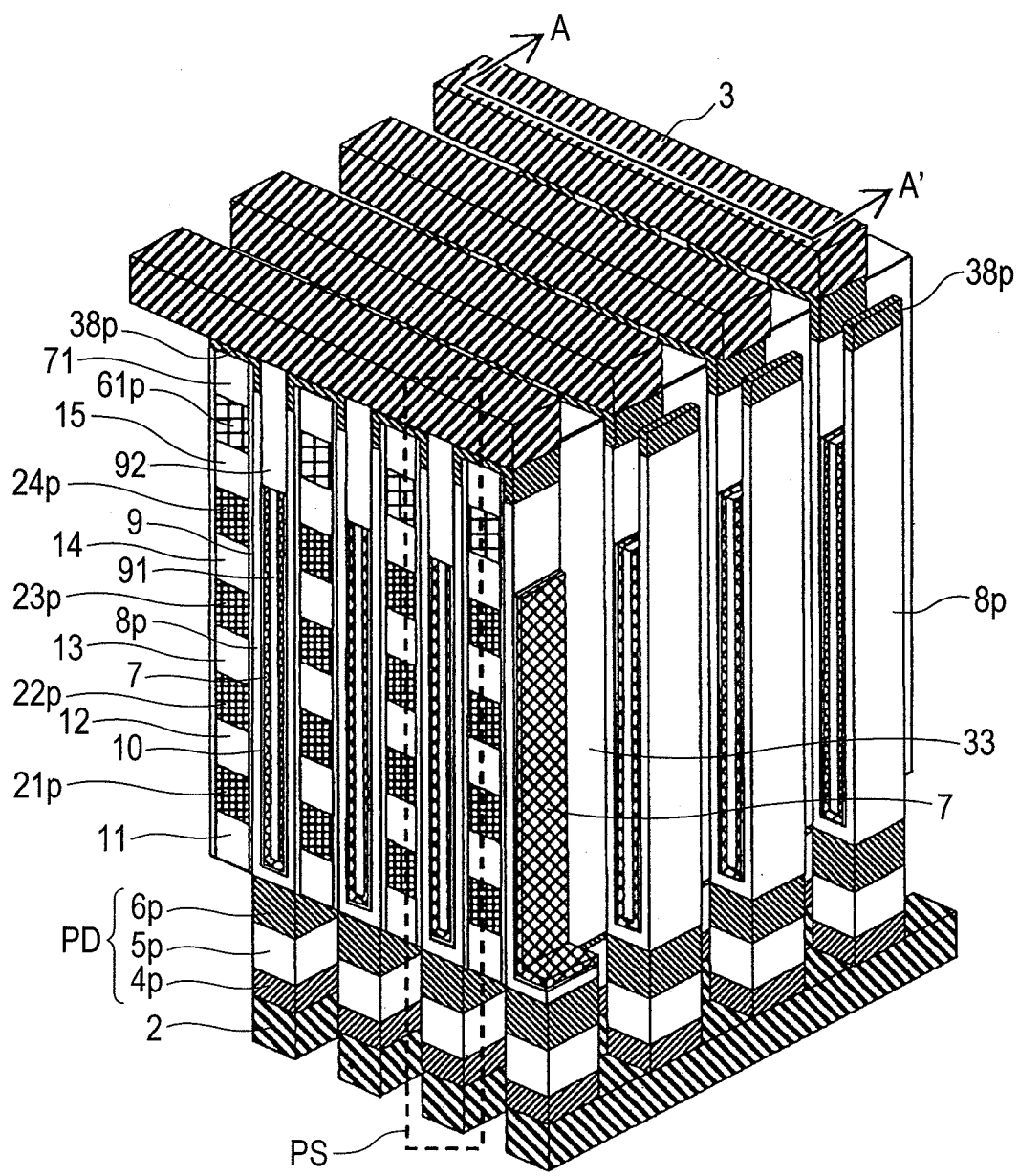
FIG. 2 is a view showing an example of a structure of a memory cell array in the phase change memory described in FIG. 1.

FIG. 2 is a view showing, particularly, a portion of the memory cell array MA extracted from FIG. 1. Above a metal film 2 having therein multiple word lines which are formed by patterning the metal film at a pitch twice as large as the minimum of feature size F (hereinafter sometimes simply referred to as a word line 2), polysilicon diodes PD are formed periodically in the extending direction of the word line 2. Although not illustrated in the drawing, the metal film for forming the word lines is formed on an insulating film deposited on a silicon substrate. The polysilicon diode PD has a structure of stacking a polysilicon layer 4p doped with p-type impurity, a polysilicon layer 5p doped with impurity at a low concentration, and a polysilicon layer 6p doped with an n-type impurity.

A stacked film of gate polysilicon layers 21p, 22p, 23p, 24p, and 61p and insulating film layers 11, 12, 13, 14, 15, and 71 are patterned in a stripe shape in a direction parallel with the word line 2, line portions of the stripes of the laminate film of the gate polysilicon layers 21p, 22p, 23p, 24p, and 61p and the insulating film layers 11, 12, 13, 14, 15, and 71 are arranged just above the inter-word line space, and space portions of the stripes of the laminate film of the gate polysilicon layers 21p, 22p, 23p, 24p, and 61p and the insulating film layers 11, 12, 13, 14, 15, and 71 are formed just above the word lines. A metal film 3 in which bit lines are formed (hereinafter sometimes simply referred to as bit line 3) is formed as a stripe shape extending in the direction perpendicular to the word line 2, formed by patterning the metal film at a pitch twice as large as the minimum of feature size F and arranged by way of an n-type polysilicon layer 38*p* above the insulating film layer 71.

The gate insulating film 9, the channel polysilicon layer 8*p*, the insulating film 10, and the phase change material layer 7 are stacked successively on the side wall of the gate polysilicon layers 21*p*, 22*p*, 23*p*, and 24*p*, on the side wall of the insulating film layers 11, 12, 13, and 14 and in the lower portion on the side wall of the insulating film 15 in the space portion of the stacked films of the gate polysilicon layers 21*p*, 22*p*, 23*p*, 24*p*, and 61*p* and the insulating film layers 11, 12, 13, 14, 15, and 71, below the bit lines 3. The insulating film layer 10 is a layer for preventing diffusion between the phase change material layer 7 and the channel polysilicon layer 8*p*. An insulating film layer 91 is buried between the phase change material layers 7 on both surfaces. The gate insulating film 9 and the channel polysilicon layer 8*p* are stacked above the side wall of the insulating film layer 15 and below the side wall of the gate polysilicon layer 61*p* and the insulating film layer 71. An insulating film layer 92 is buried between the channel polysilicon layers 8*p* on both surfaces. The gate insulating film 9 and the channel polysilicon layer 8*p* are stacked above the insulating film layer 71. The insulating film 92 is buried between the channel polysilicon layers 8*p* on both surfaces. The upper surface of the polysilicon layer 6*p* and the channel polysilicon layer 8*p* are in contact at the bottom below the bit line 3 in the space portion of the stacked film of the gate polysilicon layer 21*p*, 22*p*, 23*p*, 24*p*, and 61*p*, and the insulating film layers 11, 12, 13, 14, 15, and 71. The bit line 3 and the polysilicon diode PD are contiguous by way of a polysilicon layer 38*p* and the channel polysilicon layer 8*p* at the opposing lateral sides of the paired stacked film formed of the gate polysilicon layers 21*p*, 22*p*, 23*p*, 24*p*, and 61*p* and the insulating film layers 11, 12, 13, 14, 15, and 71.

The channel polysilicon layer 8*p*, the polysilicon layer 38*p*, the phase change material layer 7, and the insulating film layer 10 are removed in the space portion of the stacked film of the gate polysilicon layers 21*p*, 22*p*, 23*p*, 24*p*, and 61*p* and the insulating film layers 11, 12, 13, 14, 15, and 71 below the space portion of the bit lines 3 to form a space portion of the polysilicon diode PD over the word line 2. An insulating film 33 is buried in the space portion. That is, the channel polysilicon layer 8*p*, the polysilicon layer 38*p*, the phase change material layer 7, and the insulating film layer 10 are formed in a region surrounded by the stacked film of the gate polysilicon layers 21*p*, 22*p*, 23*p*, 24*p*, and 61*p* and the insulating films layers 11, 12, 13, 14, 15, and 71, and the insulating film layer 33 (hereinafter referred to as "connection hole" in the present specification). Further, a device group formed of the two phase-change-type chain cells PCC and the polysilicon diode PD is referred to as a phase-change-type string PS. FIG. 2 particularly shows a region corresponding to the phase-change-type string PS.

A device group formed on one side wall of the connection pole in such a structure is referred to as the phase-change-type chain cell PCC, details of which are to be described later. Two phase-change-type chain cells are formed opposing the side walls of the connection hole formed in a cross sectional area which is four times as large as $F^2$. Accordingly, a cross sectional area required for forming the phase-change-type chain cell can be twice as large as $F^2$. Therefore, the bottom area necessary for forming one memory cell is smaller than usual and can be $1/(k+1)$ of the value twice as large as $F^2$. The value k is identical with the number of stacked memory cells.

Figure 21:
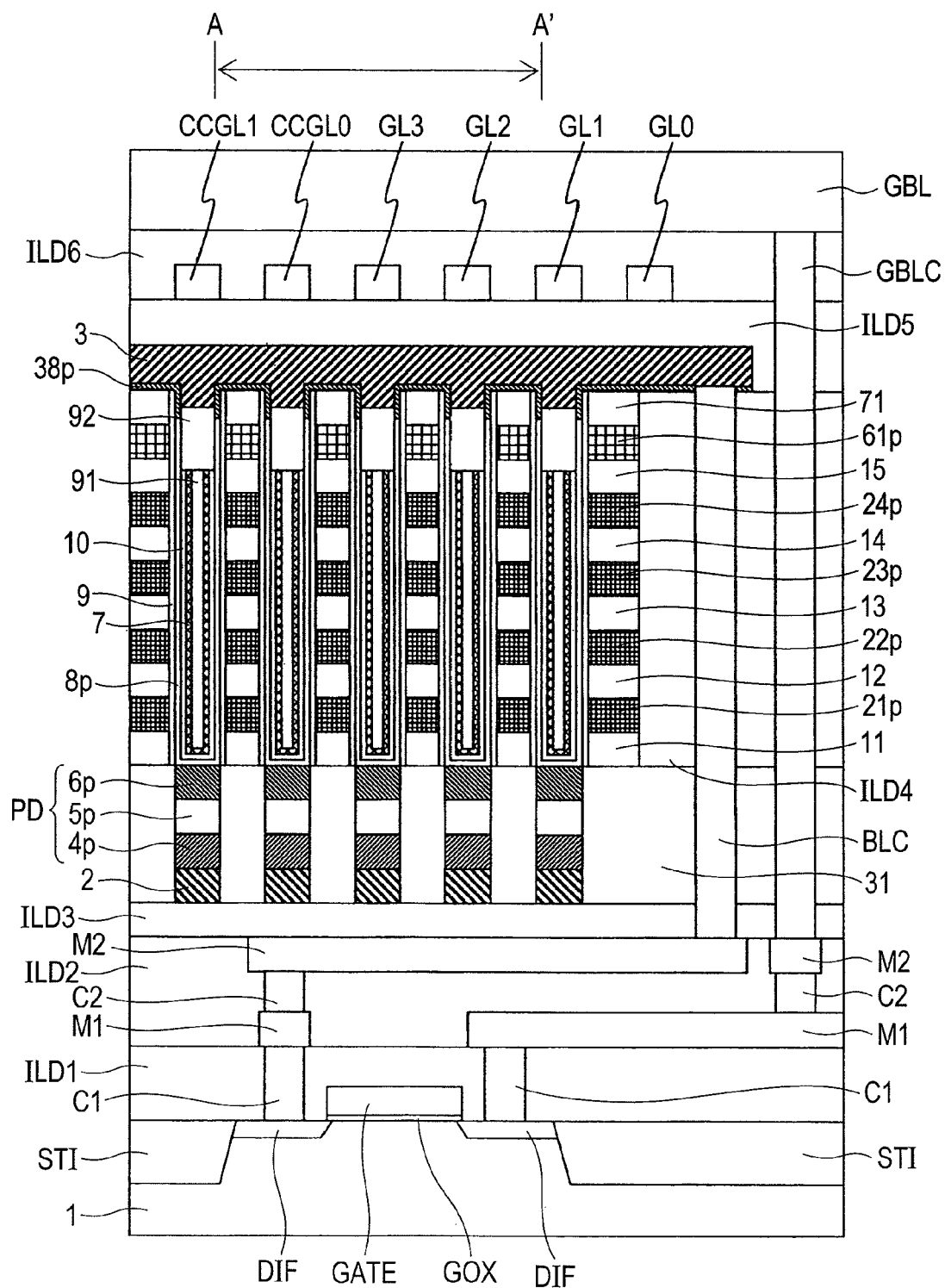
FIG. 21 is a cross sectional view showing an entire structure of the memory cell array including the cross sectional A-A' shown in FIG. 2.

FIG. 21 is a cross sectional view showing the entire structure of the memory cell array including the cross section A-A' shown in FIG. 2. This structure has a feature that the memory cell array MA shown in FIG. 1 is stacked above an MOS transistor formed over the semiconductor substrate 1. Particularly, the MOS transistor is used for connecting the bit line 3 and the global bit line GBL in the memory cell array MA. For the MOS transistor, the drawing shows a device isolation trench STI, and a gate GATE, a gate insulating film GOX, and a diffusion layer DIF of the transistor. Further, as a structure for connecting the transistor, and the bit line 3 and the global bit line GBL, F*ig*. 21 shows a portion including interlayer insulating films ILD1, ILD2, ILD3, ILD4, ILD5, and ILD6, interconnect layers M1 and M2, contact holes C1 for connecting the device on the semiconductor substrate 1 with Ml, contact holes C2 for connecting M1 and M2, gate lines GL0, GL1, GL2, and GL3, of metal interconnect for electric supply to the gate polysilicon layers 21*p*, 22*p*, 23*p*, 24*p*, and 61*p*, chain cell select gate lines CCGL0 and CCGL1 (described specifically in FIG. 3), a contact hole BLC for connecting the bit line 3 and a circuit formed above the semiconductor substrate 1, and an interlayer insulating film 31 buried between each of the polysilicon diodes PD. With such a stacked structure, an effect of remarkably promoting high integration degree of the memory cell array MA can be expected.

<<Configuration of Phase-Change-Type String>>

Figure 3:
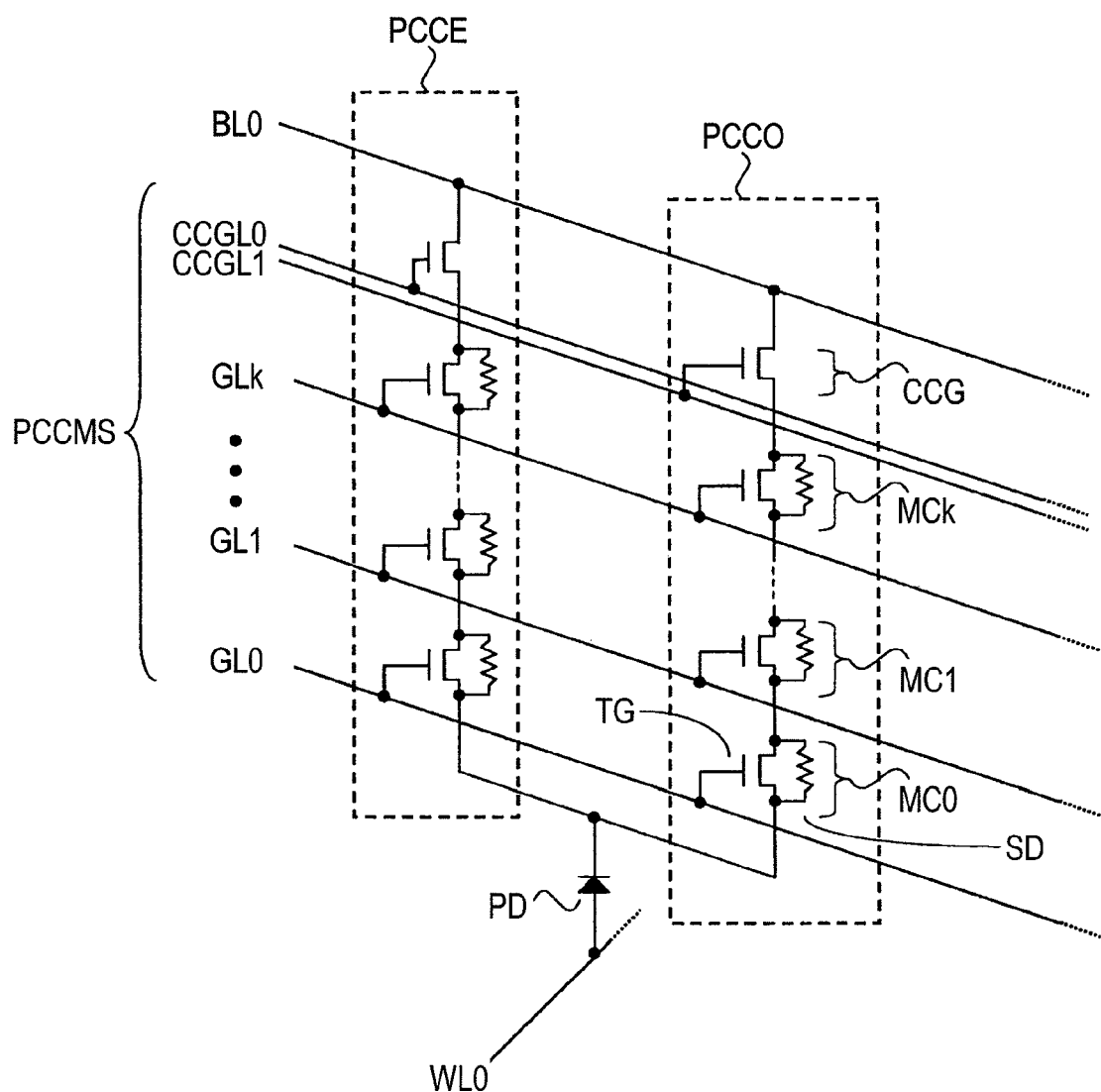
FIG. 3 is a view showing a configurational example of a phase-change-type string circuit in the memory cell array in the phase change memory described in FIG. 1.

FIG. 3 shows a circuit structure of a phase-change-type string PS00 formed at the intersection between the word line WL0 and the bit line BL0 as shown in FIG. 1. In the circuit structure, two phase-change-type chain cells PCCE and PCCO arranged in parallel are connected in series with the polysilicon diode PD connected to the word line WL0. The circuit structure is to be described specifically with reference to the structure shown in FIG. 2.

At first, the two phase-change-type chain cells PCCE and PCCO are formed opposed each other on the side walls of the connection hole described in FIG. 2. In. FIG. 3, each of the phase-change-type chain cells PCCE and PCCO has a configuration in which memory cells MC0 to MCk by the number of (k+1) and a chain cell select gate CCG are connected in series. The value k is 3 when four memory cells are stacked as shown in FIG. 2.

Each of the memory cells MC0 to MCk (k=3 in this case) includes a MOS transistor as a transfer gate TG and a variable resistance type storage device SD. Each of the gate electrodes of the transfer gates TG of the memory cells is formed with the gate polysilicon layers 21*p*, 22*p*, 23*p*, and 24*p* respectively shown in FIG. 2. Accordingly, the memory cells MC0 to MCk are formed on the side walls of the gate polysilicon layers 21*p*, 22*p*, 23*p*, and 24*p*. That is, the transfer gate TG is formed of the gate insulating film 9 and the channel polysilicon layer 8*p* deposited on the side wall of the gate polysilicon layers 21*p*, 22*p*, 23*p*, and 24*p*, on the side wall of the insulating film layers 11, 12, 13, and 14, and on the side wall in the lower portion of the insulating layer 15. More precisely, the channel polysilicon layer 8*p* forms the channel of the transfer gate TG in the memory cells MC0 to MCk at a position of a height identical with that of the gate polysilicon layers 21*p*, 22*p*, 23*p*, and 24*p*. Further, the channel polysilicon layer 8*p* forms a drain electrode or a source electrode of each of the transfer gates TG at a position of a height identical with that on the side wall of the insulating film layers 11, 12, 13, and 14 and on the side wall in the lower portion of the insulating film layer 15.

Also the position for forming the storage device SD can be understood easily by corresponding to the position where the transfer gate TG is formed. That is, the storage devices SD of the memory cells MC0 to MCk are formed with the insulating film layer 10 and the phase change material layer 7 in a region corresponding to the position of a height identical with that of the polysilicon layers 21p, 22p, 23p, and 24p. Accordingly, the portion that functions as the storage device SD is a region of a height identical with that of the gate polysilicon layers 21p, 22p, 23p, and 24p. Accordingly, the path of current flowing through the storage device SD is formed between the drain electrode and the source electrode of the transfer gate TG in the sequence of insulating film layer 10-phase change material layer 7-insulation film layer 10.

The gate electrode of a chain cell select gate CCG is formed of the gate polysilicon layer 61p shown in FIG. 2. Therefore, the chain cell select gate CCG is formed on the side wall of the gate polysilicon layer 61p. With the configuration of the phase-change-type string, the cross sectional area required for forming one memory cell can be made smaller than usual, that is, $1/(k+1)$ of a value twice as large as $F^2$.

Then, the interconnect structure of the phase-change-type string is to be described. When looking at one phase-change-type string PS00, since the gate electrode of each of the transfer gates TG in the memory cells MC0 to MCk constituting the phase-change-type chain cells PCCE and PCCO are formed of the gate polysilicon layers 21p, 22p, 23p, and 24p deposited individually in a stripe shape in the extending direction of the word line, it seems as if they are separated. In an actual case, however, as shown in the layout view of FIG. 4, gate electrodes in an identical layer are connected between the memory cells with a common interconnect by forming the pattern for each of the layers as a shape short-circuited (connected) at the end of the memory cell array MA. That is, the gate electrodes of the transfer gates TG at the first layer in the memory cell MC0 are connected with the common gate line GL0. Further, the gate electrodes of the transfer gates TG in the memory cell MC1 at the second layer are connected with the common gate line GL1. In the same manner, the gate electrodes of the transfer gates TG at the third layer in the memory cell MC2 are connected with the common gate line GL2. Further, the gate electrodes of the transfer gates TG in the memory cell MC3 at (k+1)th layer (k=3 in this case) are connected with the common gate line GLk.

Figure 4:
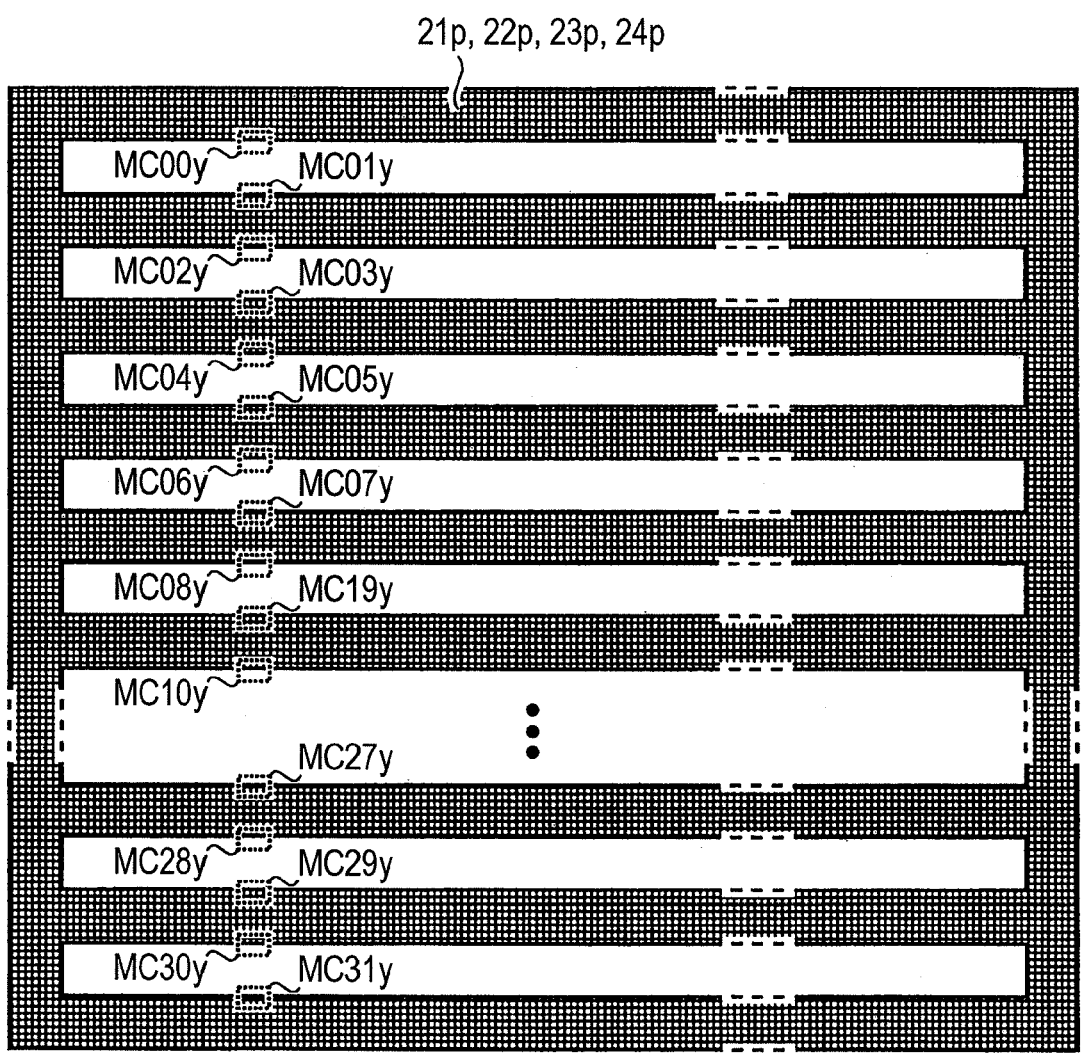
FIG. 4 is a view showing an example of a layout for gate polysilicon layer as a gate electrode of a transmission gate in the memory cell array in the phase change memory shown in FIG. 2.

When 2M bits (M is an integer of 2 or greater) are arranged in the direction of the bit line, gate polysilicon layers deposited in a stripe shape are formed by the number of (M+1). Then, for stacked gate polysilicon layers on both ends, memory cells formed on the side walls inside the memory cell array are used. Further, for other stacked gate polysilicon layers, memory cells formed on both side walls are used. For example, FIG. 4 shows an example where 32bits are arranged in the direction of the bit line. In this case, 17 gate polysilicon layers deposited in a stripe shape are formed. Then, for the stacked gate polysilicon layers on both ends, the memory cells formed on the side wall inside the memory cell array are used as the MC00y and MC31y. Further, for other stacked gate polysilicon layers on both ends, memory cells formed on the side walls inside the memory cell array are used as MC01y to MC30y.

On the other hand, since the chain select gate CCG is used for selecting one of the phase-change-type chain cells PCCE and PCCO, it is connected to individual control lines. Accordingly, the gate electrode of the chain cell select gate CCG in one phase-change-type chain cell PCCE is connected to the chain cell gate line CCGL0. The gate electrode of the chain cell select gate CCG in the other phase-change-type chain cell PCCO is connected to the chain cell select gate line CCGL1. Such an interconnect structure can be attained by opposing the so-called comb-like interconnect patterns PCCGL0 and PCCGL1 formed by bundling multiple interconnects at one end of the memory cell MA as in the layout shown in FIG. 5.

Figure 5:
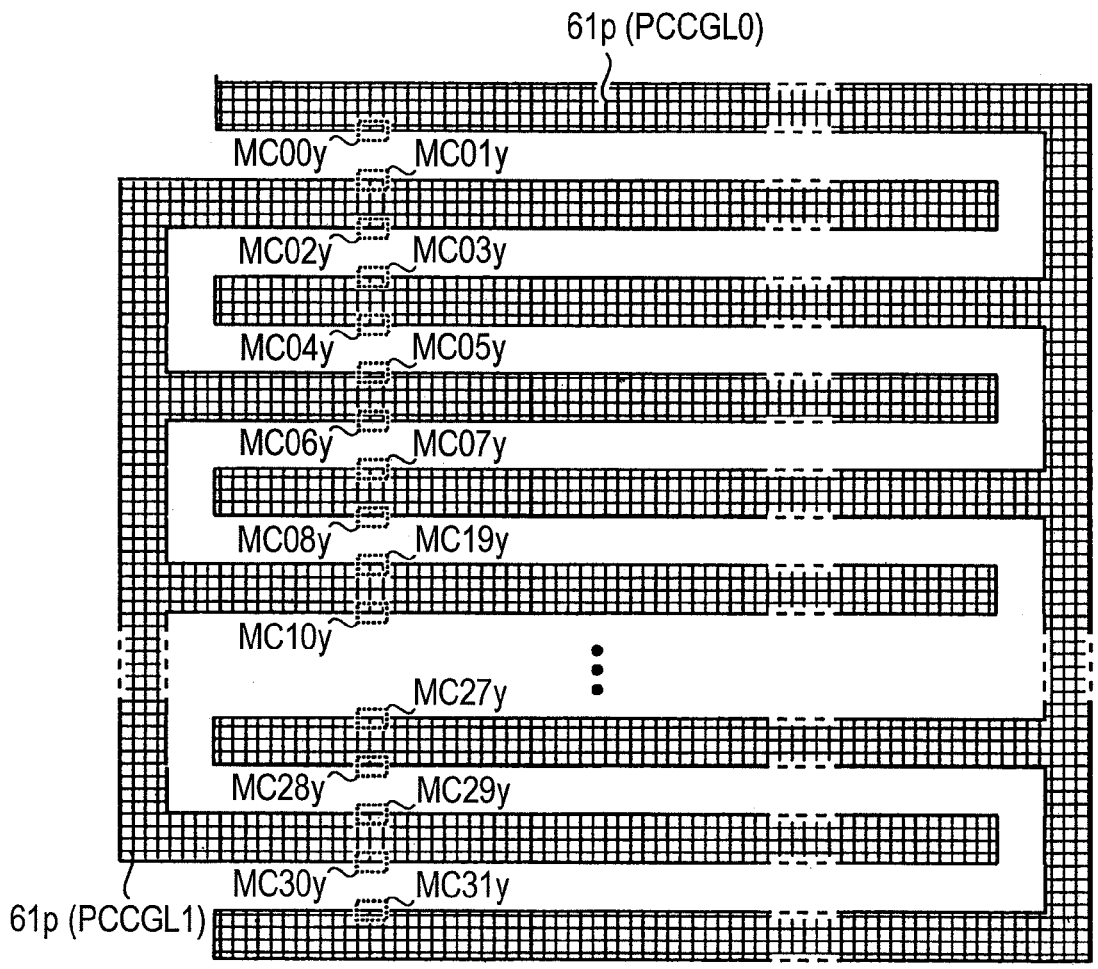
FIG. 5 is a view showing an example of a layout for the gate polysilicon layer as the gate electrode of a chain cell select gate in the memory cell array in the phase change memory shown in FIG. 2.

When 2M bits (M is an integer of 2 or greater in this case) are arranged in the direction of the bit line, they are short circuited such that a comb-like interconnect pattern having a gate polysilicon layer formed into a stripe shape by the number of (M/2+1) and a comb-like interconnect pattern having a gate polysilicon layer formed into a stripe shape by the number of (M/2) are arranged opposed each other. In this case, the number of the comb-like interconnect patterns having the gate polysilicon layer formed into a stripe shape is (M+1) which is identical to that of the stacked gate polysilicon layer shown in FIG. 4. Then, the comb-like interconnect patterns by the number of (M/2+1) are used as the chain cell select gate line CCGL0 and the comb-like interconnect patterns by the number of (M/2) are used as the chain cell select gate line CCGL1, respectively. For example, FIG. 5 shows an example of arranging 32 bits (M=16) in the direction of the bit line in the same manner as in FIG. 4. In this case, stripes by the number of 9 having gate polysilicon layers are used for the chain cell select gate line CCGL0 and, further, stripes by the number of 8 having gate polysilicon layers are used for the chain cell select gate line CCGL1, respectively.

The structure described above is summarized as described below. At first, the chain select gate line is an interconnect connected to the gate of the chain select transistor in each of the chains. In chain cell select gate lines of this embodiment, those of even numbers from the chain cell select gate line situated at the outermost side (in FIG. 5, the chain cell select gate line select MC01y, or chain cell select gate line select MC31y) are short circuited to each other. Further, those of the odd number from the chain cell select gate line situated at the outermost side are also short circuited to each other. According to the structure described above, one of the cells can be selected in the structure forming the memory cell on the side wall as shown in FIG. 2. That is either one of PCCE or PCCO can be selected in FIG. 3.

The structure in FIG. 5 has a feature that the number of PCCGL0 is greater by one than that of PCCGL1. This is because the selection system as shown in FIG. 3 can be obtained for the structure of forming the memory cell on the side wall as shown in FIG. 2. A specific selection system is as described below. MC00y and MC31y arranged at the outermost side are selected specifically by PCCGL0. Subsequently, memory cells are selected alternately at two intervals as PCCGL1, PCCGL0, PCCGL1, PCCGL0, . . . . That is, except for the outermost memory cell MC00y and MC(2M−1)y, the memory cells MC(4m+1)y and MC(4m+2)y are selected by the chain cell select gate CCGL1, the memory cell MC(4m+3)y and MC(4m) are selected by the chain cell select gate CCGL0 respectively, and the outermost MC00y and MC(2M−1)y are selected specifically by the chain cell select gate line PCCGL0 in which m is 0 to 8.

On the other hand, the word lines have no such structure in which the outermost cells are handled specifically. Accordingly, each two chains are selected orderly from the cell at the outermost side as WL0 selects MC00y and MC01y and WL1 selects MC02y and MC03y. Accordingly, the cell selected by the word line and the cell selected by the chain select gate line are displaced each by one. Therefore, there is no problem that two cells selected by the word line and two cells selected by the chain select gate line overlap completely and one of the two cells cannot be specified. For example, a case where MC01y is intended to be selected is considered. In this case, MC01y is included in a set (MC00y and MC01y) that can be selected by WL0 and included also in a set (MC01y and MC02y) that can be selected by the first chain select gate line of PCCGL1. Then, MC00y and MC02y are not overlapped. As a result, MC01y can be selected. Then, for MC00y and MC02y not intended to be selected, either WL0 or PCCGL1 is not selected. Accordingly, erroneous operation of selecting unnecessary cell does not occur.

Further, the structure in FIG. 5, that is, the number of PCCGL0 is greater by one than that of PCCGL1, and two lines at the outermost side in PCCGL0 are arranged outside of any of PCCGL1 is advantageous also with the view point of the arrangement for drivers. By adopting the combined structure of comb-like interconnect patterns and the connections as shown in the drawing, each of the interconnects can be led out in the identical direction (leftward of the word line in the drawing) to the outside of the memory cell array MA in the word line region formed having a 2F pitch.

The gate lines GL0 to GLk (k=3 in this case) and the chain cell select gate lines CCGL0 to CCGL1 described above are collectively referred to as phase-change type chain cell control signal group PCCMS in the present specification. By using the control lines in common, it is possible to decrease the number of control lines and decrease the number of driving circuits, that is, the area of the driving circuits arranged on every control line.

<<Arrangement for Various Control Lines and Driving Circuits>>

Figure 6:
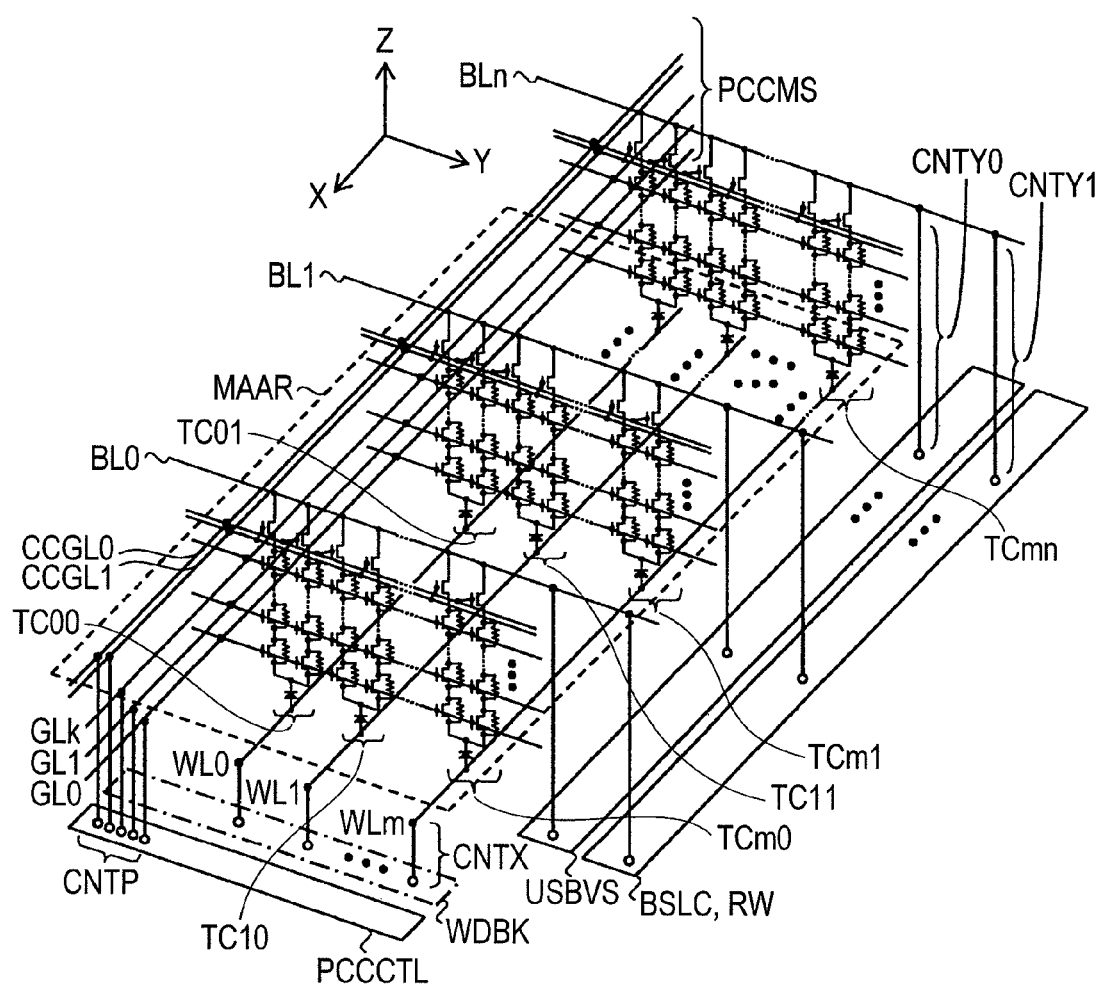
FIG. 6 is a view showing an example of an arrangement for various driving circuits of the memory cell array in the phase change memory shown in FIG. 1.

FIG. 6 sterically shows an arrangement for various control lines and driving circuits described so far corresponding to the memory cell array circuit shown in FIG. 1. In the drawing, X axis denotes the extending direction of the word line, Y axis denotes the bit line extending direction and Z axis denotes the stacking direction of the memory cells, respectively. Further, a region in which the memory cell array MA shown in FIG. 2 is projected on a silicon substrate is referred to as a memory cell array region MAAR.

In FIG. 6, each of the phase-change-type chain cell control signal groups is connected to the phase-change-type chain cell in the direction of the Y axis and, further, short circuited at one end of the bit lines BL0 to BLn. As shown in FIG. 4 to FIG. 5, actually, respective phase-change-type chain cell control signal groups are connected to the phase-change-type chain cell arranged on every row, extend in the direction of the X axis, and short circuited at the end of the word lines WL0 to WLm. The difference is caused by drawing the interconnect so as to make the configuration of the phase-change-type string easy to see in FIG. 6, but it is to be noted that they are electrically equivalent.

At first, arrangement for the interconnect and the driving circuit in the direction X is to be described. The word driver group WDBK is arranged on a silicon substrate at the outer edge of the memory array region MAAR at the extending ends of the word lines WL0 to WLm along one side of the memory array region MAAR. Multiple X-system contacts CNTX are used for the connection between the word lines WL0 to WLm and the word driver formed on the silicon substrate. In the drawing, the X-system contacts CLTX are arranged on a straight line. However, when it is difficult to form the word drivers at a pitch twice as large as the minimum of feature size F identical with that of the word line, the X-system contacts CNTX may also be arranged displaced from each other.

Figure 7:
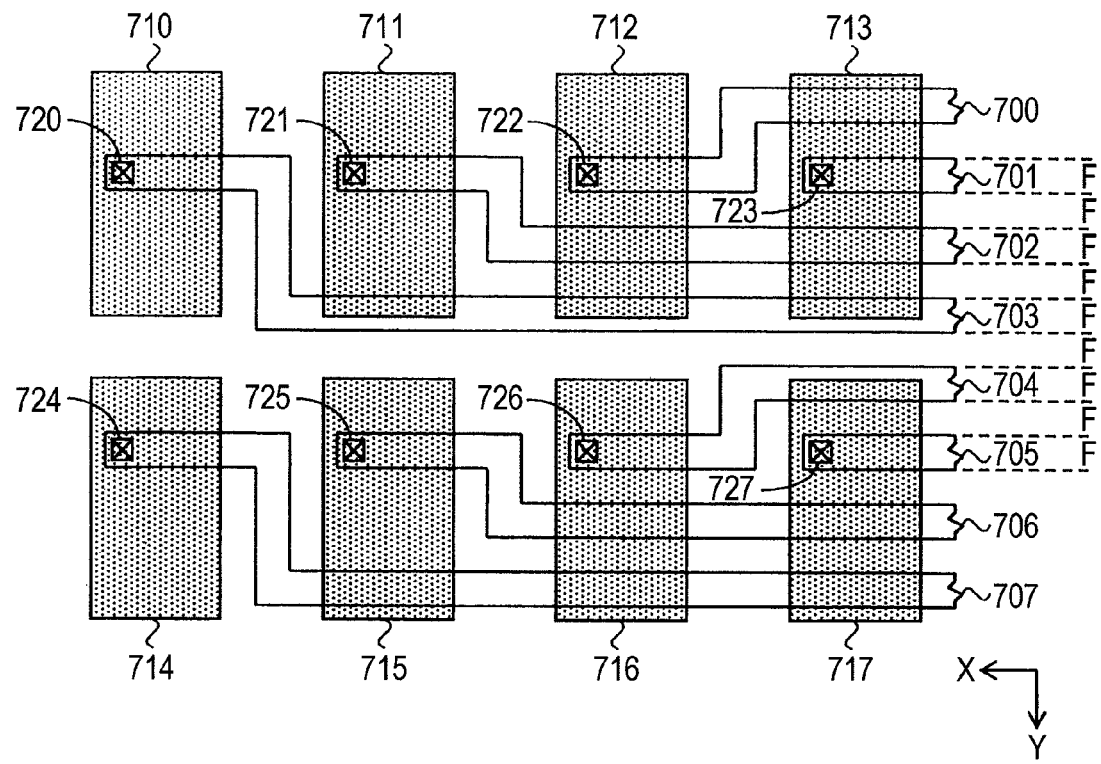
FIG. 7 is a view showing an example of a layout of word drivers in a word driver driving circuit group shown in FIG. 6.

As an example, FIG. 7 shows a layout example for word drivers. The drawing particularly shows a PMOS transistor portion forming the word drivers WD0 to WD7 that drive the word lines WL0 to WL7. 700 to 707 denote metal interconnect patterns as the word lines WL0 to WL7. 710 to 717 denote P-type diffusion regions to form source electrodes and drain electrodes of PMOS transistors formed over the silicon substrate. 720 to 727 denote X-system contacts CNTX for connecting the word lines WL0 to WL7 and the PMOS transistor. By arranging the P type diffusion regions 710 to 717 while dividing them into a set of 710 to 713 and a set of 714 to 717 each by four in the extending direction of the word lines WL0 and WL7, the word drivers can be arranged with no loss while moderating the length in the direction of the Y axis in the individual word drivers to a pitch 8 times as large as the minimum of feature size F. As a result, the X-system contacts CNTX are arranged at positions displaced from each other.

Now, considering the configuration of the word driver group WDBK shown in FIG. 7, control signal driving circuit group system contacts CNTP of the phase-change-type chain cell for connecting the phase-change-type chain cell control signal group PCCMS and the phase-change-type chain cell control circuits PCCCTL formed over the silicon substrate are arranged outside of the word diver group WDBK. This is because there is no room for forming the contacts CNTP, since the word lines are formed at a pitch twice as large as the minimum of feature size F in the region where the word driver group WDBK is formed. Further, this is because there is no room for arranging those other than the word driver. Since the phase-change-type chain cell control signal groups PCCMS are formed of a metal interconnect layer above the word lines WL0 to WLm, they can override the word driver groups WDBK. Therefore, a phase-change-type chain cell control circuit PCCCTL is arranged to the outer edge of the memory cell array region further remote from the word driver group WDBK. With such a method of arrangement, the word driver groups WDBK and the phase-change-type chain cell control circuit PCCCTL can be arranged efficiently.

Then, arrangement for the interconnects and the driving circuits in the direction Y are to be described. A non-select bit line voltage supply circuit USBVS is arranged between a bit line select circuit BSLC and a read/write circuit RW, and the memory cell array region MAAR. For both of the non-select bit line voltage supply circuit USBVS and the bit line select circuit BSLC, in the regions where each of them is arranged, bit lines BL0 to BLn at a pitch twice as large as the pitch of the minimum of feature size F and transistors arranged to each of them are formed. However, since the read/write circuit RW belongs to the bit line select circuit BSLC, the layout structure is made asymmetrical by so much. Generally, a layout structure of high efficiency can be attained more easily by arranging circuit blocks of high symmetricity adjacent to each other. Accordingly, it is preferred that the non-select bit line voltage supply circuit USBVS is arranged adjacent to the memory cell array region MAAR. Each of the bit lines BL0 to BLn are connected by way of Y-system contacts CNTY0 to the non-select bit line voltage supply circuit USBVS. Further, they are connected by way of Y-system contacts CNTY1 to the bit line select circuit BSLC and the read/write circuit RW. For the arrangement of the Y-system contact, they may also be formed at positions displaced from each other in the same manner as the word driver group WDBK as described above.

Figure 8:
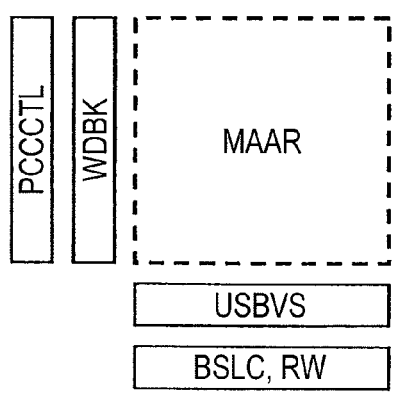
FIG. 8 is a view schematically showing an example of an arrangement for various driving circuits shown in FIG. 6.

FIG. 8 schematically shows the arrangement of the driving circuits described above. Various driving circuits are arranged at the periphery of the memory cell array region MAAR. Highly efficient layout arrangement is possible by arranging highly symmetric driving circuits that are as connected to interconnects formed at a pitch twice as large as the minimum of feature size F adjacent to the memory cell array region MAAR. Further, the layout efficiency can be improved more when a power source supply line, a control signal line, or a power source stabilizing capacitance, etc. are formed in a space formed between the word lines and the silicon substrate in the memory cell array region MAAR.

<<Operation of Memory Cell Array>>

Figure 9:
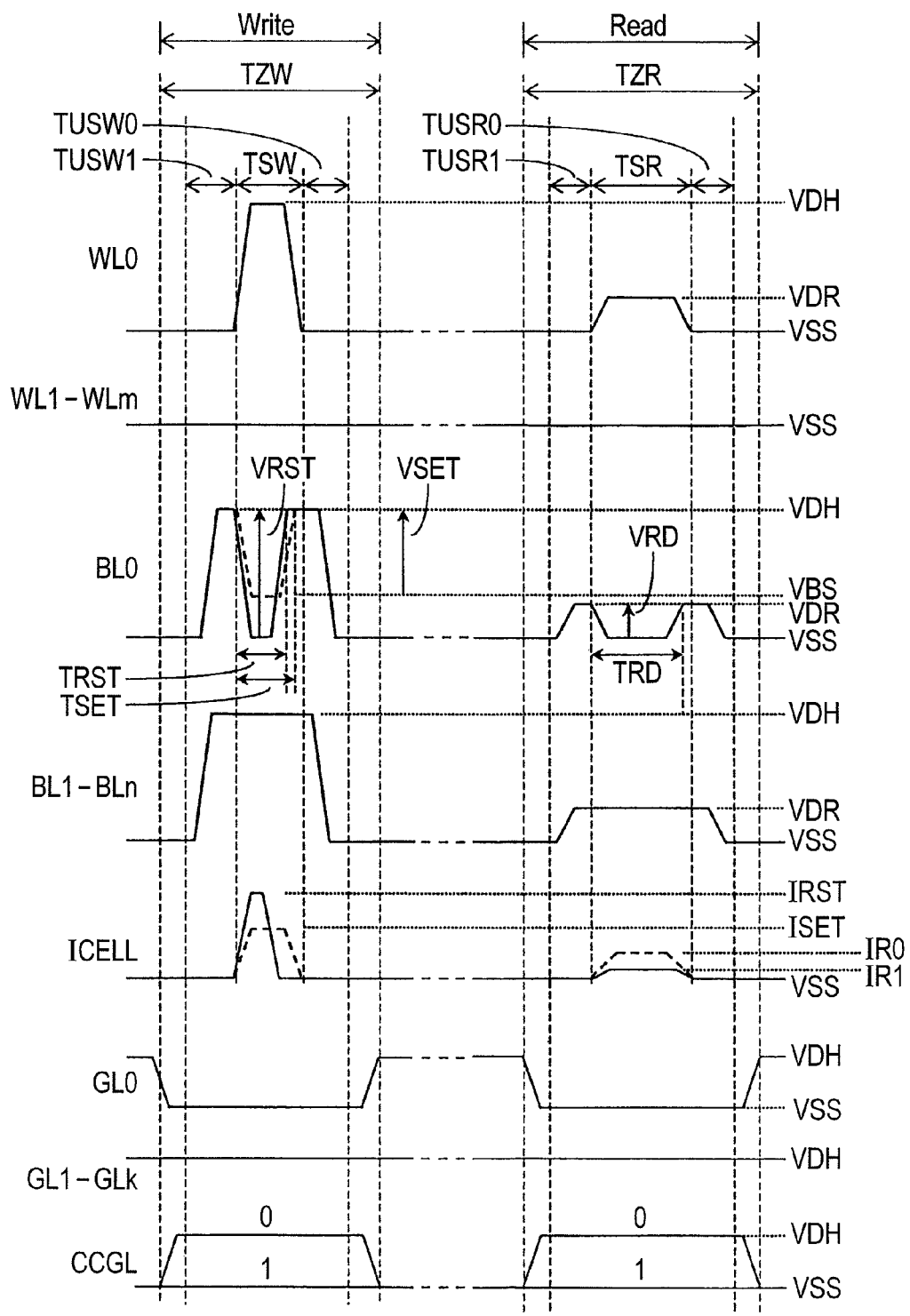
FIG. 9 is a view showing an example of an operation timing chart of the memory cell array in the phase change memory shown in FIG. 1.

Then, operation of the memory cell array is to be described. FIG. 9 shows rewriting operation and read operation. A memory cell to be selected is a memory cell MC0 in the phase-change-type chain PCCE of the phase-change-type string PS00 shown in FIG. 1 and FIG. 3. The operation of the memory cell array in FIG. 9 has a feature in defining the coordinate Z at first and then defining the coordinate Y and the coordinate X upon selecting one memory cell from the memory cell array of the sterical structure. For making this clear, the drawing expresses a Z selection period in the rewrite operation as TZW, periods of putting all of the phase-change-type strings to a non selected state in the Y selection period and the X selection period as TUSW0 and TUSW1, and a period of selecting one phase-change-type string in the Y selection period and the X select period as TSW, respectively. Further, it expresses the Z selection period in the read operation as TZR, a period of putting all of the phase-change-strings to the non selected state in the Y selection period and the X selection period as TUSR0 and TUSR1, and a period of selecting one phase-change-type string in the Y selection period and the X selection period as TSR, respectively.

At first, the rewrite operation is to be described. During a standby state, gate lines GL0 to GLk are kept at an elevated voltage VDH, and chain cell select gate lines CCGL0 to CCGL1 are kept at a ground voltage VSS. The elevated voltage VDH is a voltage elevated from a power source voltage VDD by a power source circuit inside a chip. When the rewrite operation is started to reach the Z selection period TZW, the gate line GL0 being kept at the elevated voltage VDH is driven to the ground voltage VSS in accordance with an address signal not illustrated in FIG. 9. As a result, a transfer gate TG in a memory cell MC0 of phase-change-type strings PS00 to PSmn is cut off. On the other hand, when the chain select gate line CCGL0 being kept at the ground voltage VSS is driven to the elevated voltage VDH, the chain select gate CCG in the phase-change-type chain cell PCC0 of the phase-change-type strings PS00 to PSmn is put to a conduction state.

Then, the bit lines BL0 to BLn at the ground voltage VSS are driven to the elevated voltage VDH and the state is kept for a time TUSW0. In this step, a negative voltage "−VDH" is applied to the phase-change-type chain cell PCC0 or the phase-change-type strings PS00 to PSmn. In this case, in each of the phase-change-type chain cells PCC0, a minute diode current flows from the bit line by way of the phase-change-type chain cell PCCE and the polysilicon diode PD toward the word line. Particularly, the current path in the phase-change-type chain cell PCCE is formed by serial connection of the transfer gate TG in the memory cells MCk to MC1 and a storage device SD in the memory cell MC0. However, since the polysilicon diode PD in each of the phase-change-type strings PS00 to PSmn is in a reverse bias state, the current flowing through the storage device SD in the memory cell MC0 is not at such a value as changing the crystal state of the storage device SD. Accordingly, stored information of the memory cell MC0 in the phase-change-type chain cell PCCE of the phase-change-type strings PS00 to PSmn is maintained.

Successively, the selected bit line BL0 at the elevated voltage VDH is driven to the ground voltage VSS or a bit line set voltage VBS and the word line WL0 kept at the ground voltage VSS is driven to the elevated voltage VDH while keeping the word lines WL1 to WLm at the ground voltage VSS to maintain the state only for the selected period TSW. By such control, a positive voltage "VRST or VSET" is applied only to the phase-change-type string PS00. In this case, VRST=VDH>VSET=VDH−VBS>VSS. Accordingly, since the polysilicon diode PD in the phase-change-type string PS00 is in a forward bias state, a current IRST sufficient to change the crystalline state into the amorphous state is applied to the storage device SD of the memory cell MC0 in the phase-change-type chain cell PCCE. After keeping the bit line BL0 at the ground voltage VSS only for the reset time TRST<TSW, when it is driven instantaneously to the elevated voltage VDH, the storage device SD is quenched by current cut off to turn the storage device SD into the amorphous state. That is, the resistance value of the storage device SD increases. On the other hand, by keeping the bit line BL0 at the bit line set voltage VSET only for the set time TSET<TSW which is longer than the reset time TRST, a set current ISET to heat the storage device SD to a temperature optimal to the crystal growing is applied continuously. Accordingly, the storage device SD is turned to a crystalline state and the resistance value thereof is lowered.

When the set operation has been completed, the bit line BL0 at the bit line set voltage VBS is driven to the elevated voltage VDH, and the word line WL0 at the elevated voltage VDH is driven to the ground voltage VSS to turn all of the phase-change-type strings PS00 to PSmn into a reverse bias state only for the non-selected period TUSW1. In this state while a minute diode current flows through all the phase-change-type strings PS00 to PSmn as described above, the current is not at such a value as changing the crystal state of the storage device SD of the memory cell MC0 in the phase-change-type chain cell PCCE. Accordingly, the stored information of the memory cell MC0 is maintained. Successively, by driving the bit lines BL0 to BLn being kept at the elevated voltage VDH to the standby voltage VSS, the period of putting all of the phase-change-type chain cells PCCE to the non-selected state is terminated. Finally, by driving the gate line GL0 being kept at the ground voltage VSS to the elevated voltage VDH and the chain cell select gate line CCGL0 being kept at the elevated voltage VDH to the ground voltage VSS, the Z selection period TZW is terminated. The rewrite operation has thus been completed.

Then, the read operation is to be described. During the standby state, the gate lines GL0 to GLk are kept at the elevated voltage VDH and the chain cell select gate lines CCGL0 to CCGL1 are kept at the ground voltage VSS. When the read operation is started to reach the Z selection period TZR, the gate line GL0 being kept at the elevated voltage VDH is driven to the ground voltage VSS in accordance with an address signal not illustrated in FIG. 9. As a result, the transfer gates TG in the memory cells MC0 of the phase-change-type strings PS00 to PSmn are cut off. On the other hand, when the chain cell select gate lines CCGL0 being kept at the ground voltage VSS is driven to the elevated voltage VDH, the chain select gate CCG in the phase-change-type chain cells PCC0 in the phase-chain-type strings PS00 to PSmn is put to a conduction state.

Then, the bit lines BL0 to BLn being kept at the ground voltage VSS are driven to the read voltage VDR. In this embodiment, in order not to destroy the stored information of the memory cell selected in the read operation, the read voltage VDR is controlled to a voltage level lower than the elevated voltage VDH by a power source circuit not shown in FIG. 1. A negative voltage "−VDR" is applied to the phase-change-type strings PS00 to PSmn for the time TUSR0. In this state, a minute diode current flows from the bit line by way of the phase-change-type chain cell PCCE and the polysilicon diode PD toward the word line in each of the phase-change-type strings. Particularly, the current path in the phase-change-type chain memory PCCE is formed by serial connection between the transfer gates TG in the memory cells MCk to MC1 and the storage device SD in the memory cell MC0. However, since the polysilicon diode PD in each of the phase-change-type strings PS00 to PSmn is in a reverse bias state, current flowing through the storage device SD in the memory cell MC0 is not at such a value as changing the crystal state of the storage device SD. Accordingly, the stored information of the memory cell MC0 in the phase-change-type chain cell PCCE of the phase-change-type strings PS00 to PSmn is maintained.

Successively, the select bit line BL0 being kept at the read voltage VDR is driven to the ground voltage VSS and the word line WL0 being kept at the ground voltage VSS is driven to the read voltage VDR while keeping the word lines WL1 to WLm at the ground voltage VSS and kept for the selection period TSR. By such control, a positive voltage "VRD" is applied only to the phase-change-type string PS00, in which 0<VRD<VSET<VRST. Accordingly, since the polysilicon diode PD in the phase-change-type string PS00 is put to a forward bias state, current in accordance with the crystal state flows to the storage device SD of the memory cell MC0 in the phase-change-type chain cell PCCE. The drawing shows that the read current IR0 in the crystalline state is larger than the read current IR1 in the amorphous state. In order to generate a read signal at such a level that can be detected by the sense amplifier SA in the read circuit RW shown in FIG. 1, the bit line BL0 is kept at the ground voltage VSS only for the selection time TRD<TSR and then it is driven to the read voltage VDR thereby cutting off the read current.

When the read operation to the sense amplifier SA has been completed, the word line WL0 being kept at the read current VDR is driven to the ground voltage VSS to turn all of the phase-change-type strings PS00 once to PSmn to a reverse bias state only for the non-selection period TUSR1. In this state, while a minute diode current flows to all of the phase-change-type strings PS00 to PSmn, the current is not at such a value as changing the crystal state of the storage device SD in the memory cell MC0 in the phase-change-type chain cell PCCE as described above. Accordingly, the stored information of the memory cell MC0 is maintained. Successively, by driving the bit line BL0 to BLn being kept at the read voltage VDR to the standby voltage VSS, the period of putting all of the phase-change-type strings to a no-selection state is terminated. Finally, by driving the gate line GL0 being kept at the ground voltage VSS to the elevated voltage VDH and the chain cell select gate line CCGL0 being kept at the elevated voltage VDH to the ground voltage VSS, the Z selection operation has been completed. With the procedures described above, the read operation has been completed.

Summarizing the read/write operation described above, in the memory cell array according to this embodiment, the coordinate X is at first defined and then the selecting operation for the coordinate Y and the coordinate X for deciding the phase-change-type string is performed. By such selecting operation, a current pulse can be applied only for the period in accordance with the operation by using the read/write circuit.

For easy understanding of the operation, an operation of defining the coordinate Z at first and then selecting the coordinate Y and the coordinate X has been explained so far. However, the operation sequence is not restricted thereto but can be changed within a range not departing the restrictive matters described so far. In other words, it may be suffice to define the coordinate Z till at least the coordinate Y and the coordinate X are selected. More specifically, the bit lines BL0 to BLn to be driven at the ground voltage are at first driven to a high level.

Successively, the coordinate Z is defined by driving the gate line GL0 and the chain select gate line CCGL0. Then, a desired memory cell is selected by driving only the bit line BL0 to be selected. By the operation sequence described above, selecting operation satisfying the restrictions explained so far can be attained. When returning to the standby state, procedures may be performed opposing to the operation sequence described above.

In accordance with the constitution and the operation described above, the following three advantageous effects can be obtained. The first effect is that a bottom area required for forming one memory cell can be decreased by forming the memory cell on the side wall of the connection hole as shown in FIG. 2. The bottom area can be decreased further by stacking such memory cells. The second effect is that the number of control lines can be decreased and the number of driving circuits arranged on every control line, that is, the area for the driving circuits can be decreased by using the gate lines GL0 to GLk and the phase-change-type chain cell control signal groups PCCMS in common as shown in FIG. 6. The third effect is that a highly efficient layout arrangement can be attained by arranging driving circuits having high symmetricity as connected to interconnects formed at a pitch twice as large as the minimum of feature size F in adjacent with the memory cell array region MAAR as shown in FIG. 6 or FIG. 8. The fourth effect is that a current pulse can be applied only for the period in accordance with the operation by using the read/write circuit by defining the coordinate Z at first and then performing the selecting operation for the coordinate Y and the coordinate X that determines the phase-change-type string as shown in FIG. 9.

Second Embodiment

Figure 10:
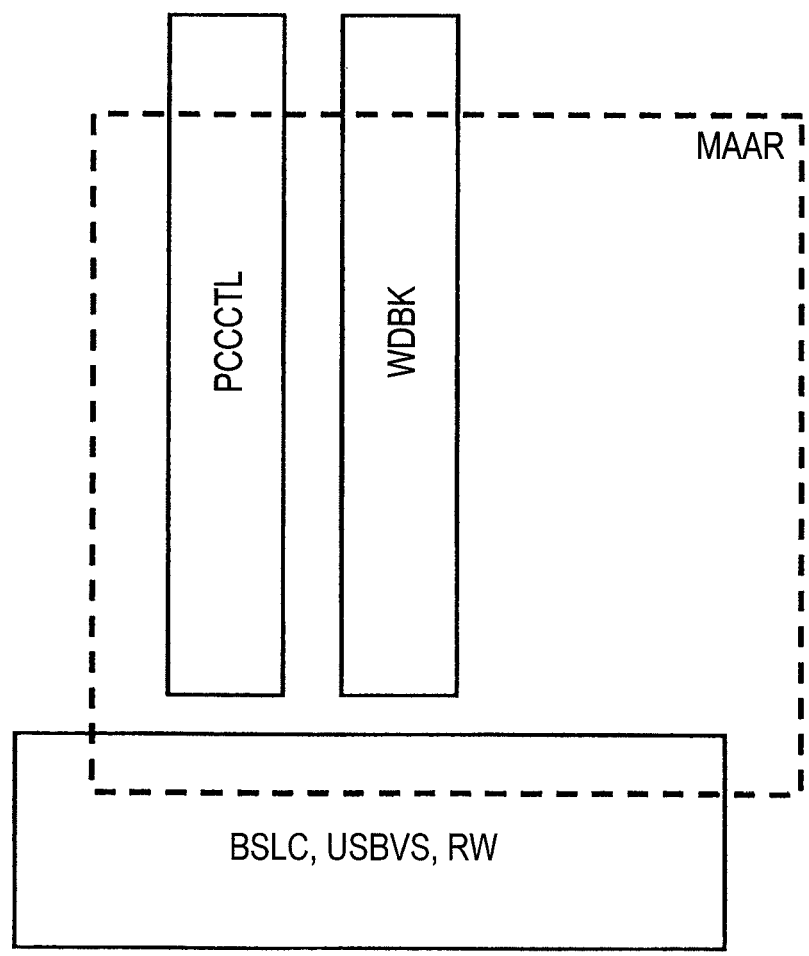
FIG. 10 is a view schematically showing an example of an arrangement for various driving circuits in a semiconductor device of a second embodiment according to the invention.

In the first embodiment described above, driving circuits etc. are arranged at the periphery of the memory cell region MAAR as shown in FIG. 8. However, as described above, since the silicon substrate just below the memory cell array region MAAR is an empty place, it is possible to form a portion of the word driver group WDBK, the phase-change-type chain cell control circuit PCCCTL, and the non-select bit line voltage supply circuit USBVS in this region. FIG. 10 is a layout chart schematically showing such an arrangement. In accordance with the layout, the chip area can be decreased. As a result, a low cost phase change memory can be attained.

Third Embodiment

In this embodiment, another configuration for the memory cell array of the phase change memory is to be described. This embodiment has the following two features. The first feature is that the memory cell array includes multiple memory tiles. The second feature is that multiple memory tiles use a read/write circuit in common.

Figure 11:
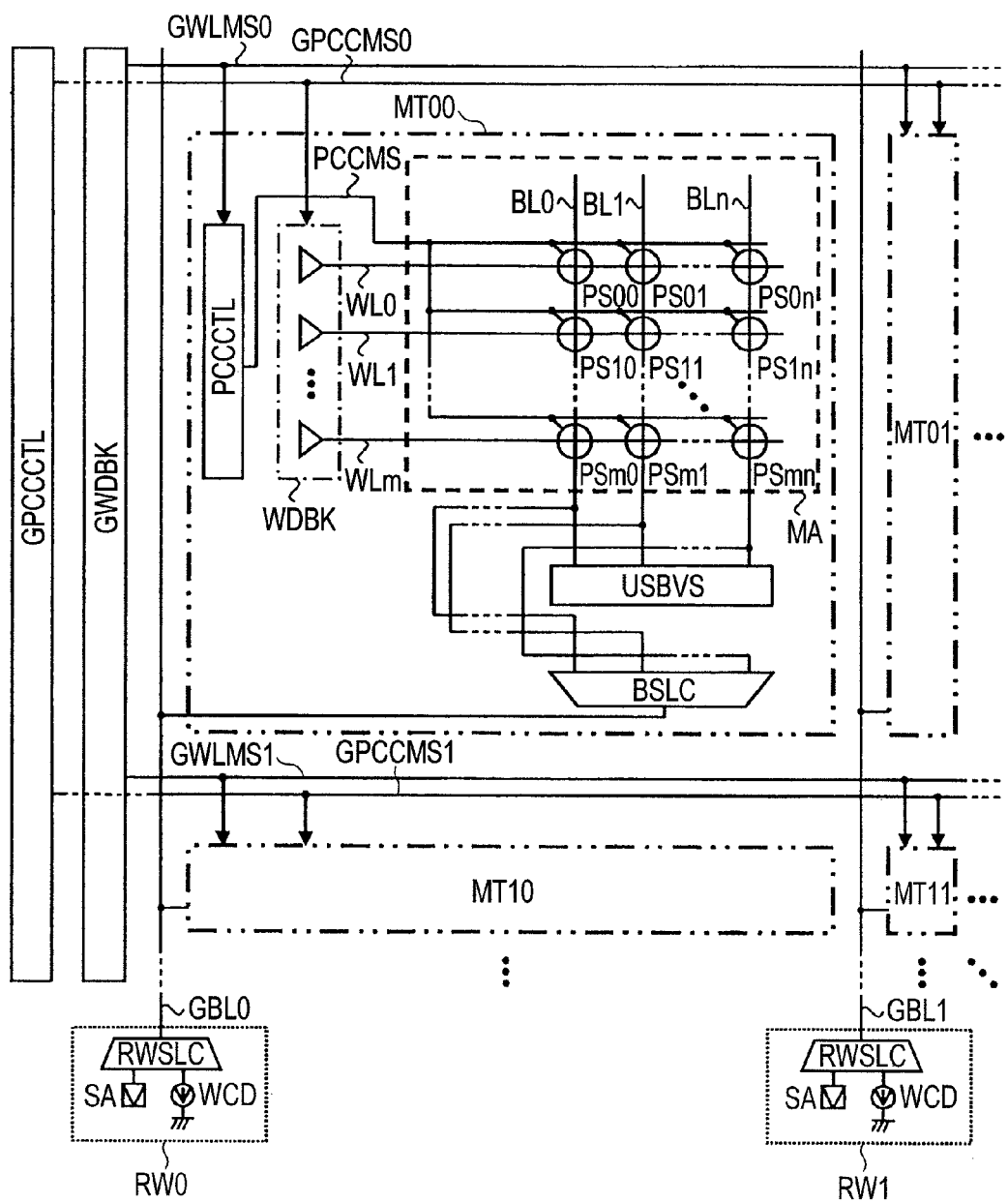
FIG. 11 is a view showing a configurational example of a memory cell array circuit of a phase change memory in a semiconductor device of a third embodiment according to the invention.

FIG. 11 shows a configuration of a memory cell array according to this embodiment. The drawing shows, as an example, memory tiles MT00 to MT11 each arranged at intersection between the global word line groups GWLMS0 to GWLMS1 and global bit lines GBL0 to GBL1. Each of the memory tiles MT00 to MT11 includes a circuit block excluding the read/write RW from the memory cell array shown in FIG. 1. Read/write circuits RW0 to RW1 are arranged to the global bit lines GBL0 to GBL1, respectively.

The global word line groups GWLMS0 to GWLMS1 are controlled by a global word line driver group GWDBK. Each of the global word line groups GWLMS0 to GWLMS1 has global word lines by the number identical with that for the word lines WL0 to WLm (by the number of (k+1)) arranged in the corresponding memory tile. Accordingly, it is desired that the global word lines are formed at a pitch twice as large as the minimum number of size F in the same manner as the word line.

Further, the global phase-change-type chain cell control signal groups GPCCMS0 to GPCCMS1 are arranged in parallel with the global with the word line groups GWLMS0 to GWLMS1 on every row of the memory tile array. The global phase-change-type chain cell control signal groups GPCCMS0 to GPCCMS1 are controlled by the global phase-change-type chain cell control circuit GPCCCTL. In order to efficiently arrange the global word driver groups GWDBK and the global phase-change-type chain cell control circuit GPCCCTL, it is desired that the global word driver group GWDBK is arranged between the global phase-change-type chain cell control circuit GPCCCTL and the memory tile group based on the method of arranging the word driver group WDBK and phase-change-type chain cell control circuit PCCCTL in the memory tile considering that the global word lines are formed at a pitch twice as large as the minimum of figure size F in the same manner as the word line as described above.

Figure 12:
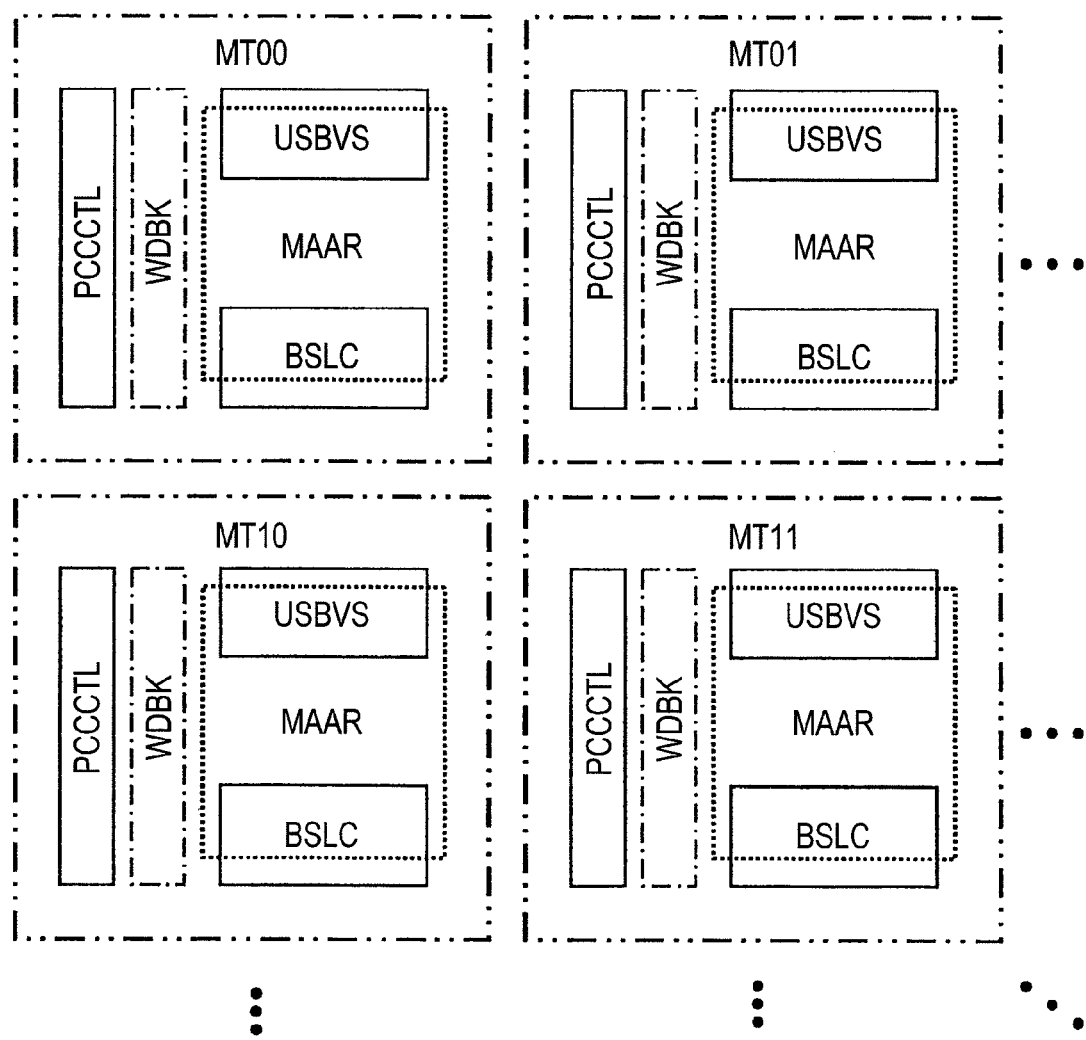
FIG. 12 is a view schematically showing an example of arrangement for the various driving circuits in the memory cell array shown in FIG. 11.

FIG. 12 schematically shows an arrangement for various driving circuits in the memory tile. In the drawing, a bit line select circuit BSLC including NMOS transistors and a non-select bit line voltage supply circuit USBVS are arranged respectively just below a memory cell array region MAAR. Further, a word driver group WDBK of CMOS configuration and a phase-change-type chain cell control circuit PCCCTL are arranged at the outer edge of the memory cell array region MAAR.

The memory cell array configuration described above can provide the following four advantageous effects. The first effect is that read operation or rewrite operation can be performed simultaneously to more number of memory cells by selecting multiple memory tiles arranged in an array. This effect is particularly effective in a case where a current required for the reset operation of the storage device using the phase-change material is large and the number of memory cells that can be driven by one word driver is suppressed.

The second effect is that the number of read/write circuits can be decreased by using the read/write circuit in common for multiple memory tiles. This effect can provide a phase change memory chip of small area. That is, the cost of the phase change memory chip can be decreased.

The third effect is that by arranging the global word driver group GWDBK between the global phase-change-type chain cell control circuit GPCCCTL and the memory tile group, the area required upon forming the circuits can be decreased. This effect can further provide a phase change memory chip of further smaller area.

The fourth effect is that since the bit line select circuit BSLC and the non-select bit line voltage supply circuit USBVS are arranged respectively just below the memory cell array region MAAR, the driving circuits can be arranged efficiently just below the memory cell array region MAAR. Since the word driver group WDBK and the phase-change-type chain cell control circuit PCCCTL of CMOS configuration respectively have PMOS transistors requiring large size and well separation region, they are generally larger compared with the bit line select circuit BSLC and the non-selection bit line voltage supply circuit USBVS including NMOS transistors. This may possibly deteriorate the symmetricity of the layout structure to the memory cell array region MAAR and lower the layout efficiency depending on the case. Since the way of arrangement of this embodiment can minimize such drawback, a phase change memory chip of a further smaller area can be attained in conjunction with the effects described above.

Fourth Embodiment

Figure 13:
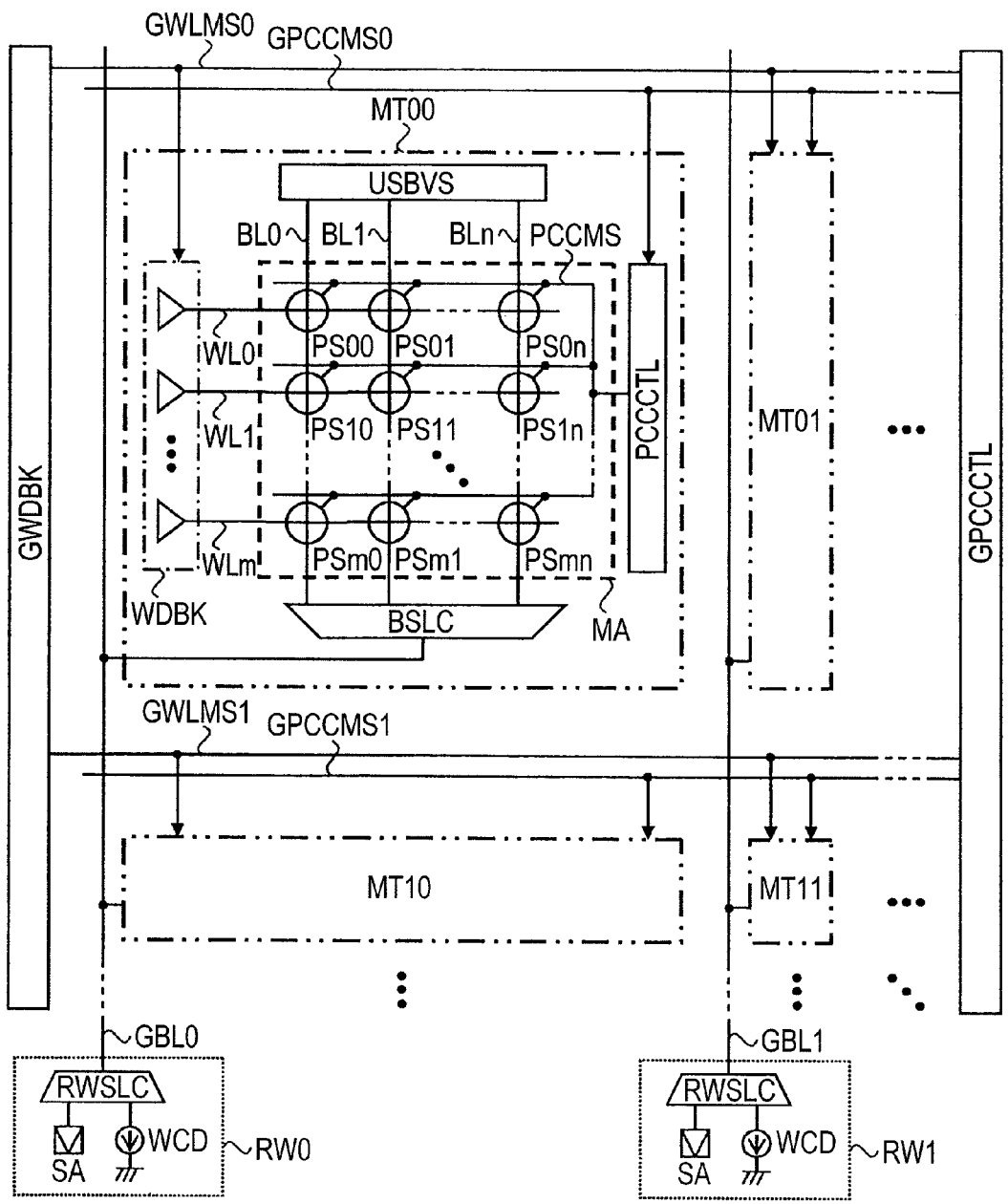
FIG. 13 is a view showing configurational example of a memory cell array circuit of a phase change memory in a semiconductor device according to a fourth embodiment of the invention.

In this embodiment, further a configuration of the memory cell array of the phase change memory is to be described. FIG. 13 shows a configuration of a memory cell array in this embodiment. This embodiment has the following two features when compared with the memory cell array of the configuration shown in FIG. 11. The first feature is that a word driver group WDBK and a phase-change-type chain cell control circuit PCCCTL are arranged opposed each other sandwiching the memory cell array MA therebetween in a memory tile. The second feature is that a bit line select circuit BSLC and a non-select bit line voltage supply circuit USBVS are arranged opposed each other sandwiching the memory cell array MA therebetween.

Figure 14:
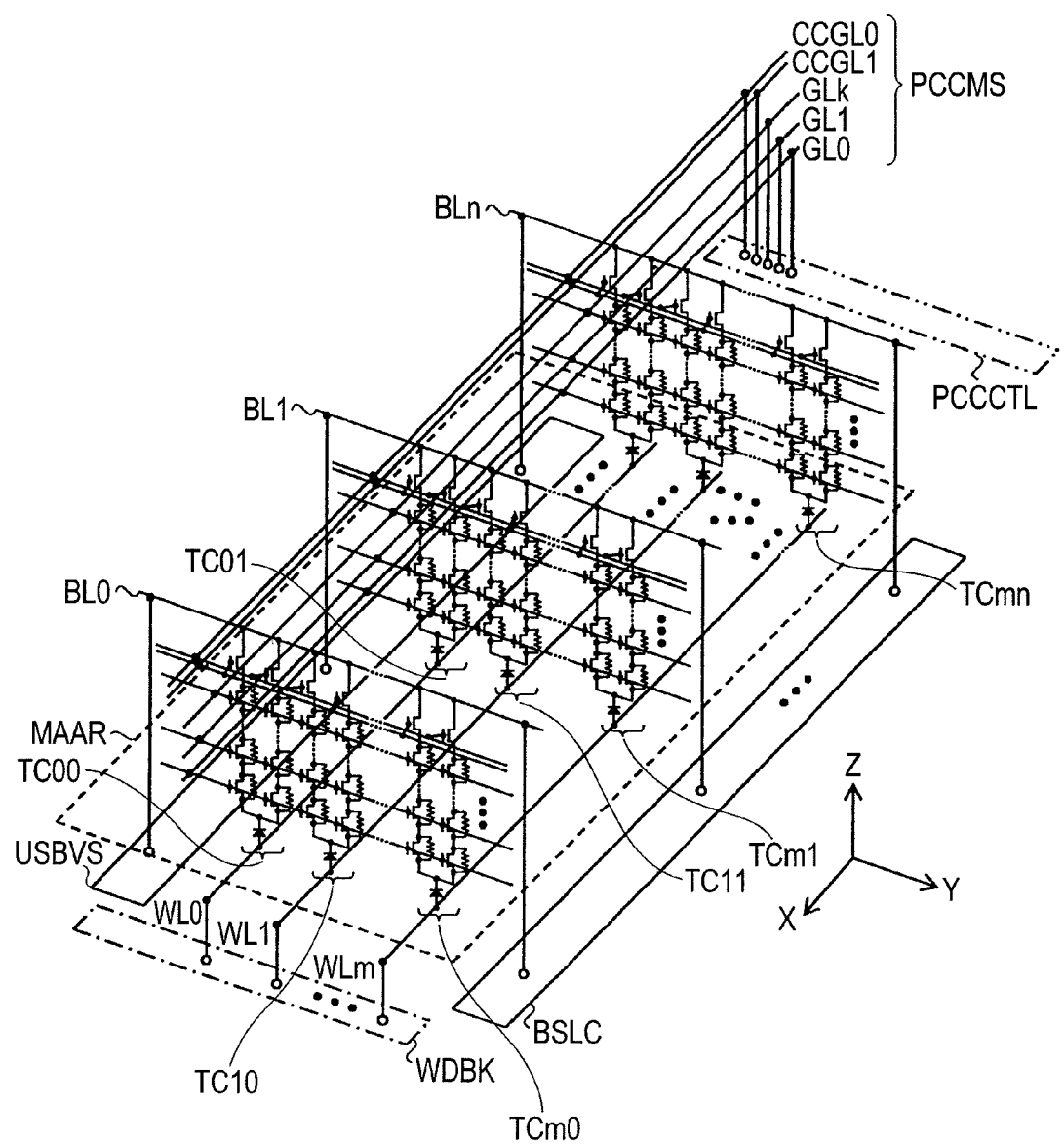
FIG. 14 is a view showing an example of an arrangement for various driving circuits of a memory tile in the phase change memory shown in FIG. 13.

FIG. 14 shows a steric arrangement for various control lines and driving circuits corresponding to the memory tile shown in FIG. 13. The word drive group WDBK is arranged at one end of the word line WL0 to WLk. The phase-change-type chain cell control circuit PCCCTL is arranged on the side opposing the word diver group WDBK. The bit line select circuit BSLC is arranged at one end and the non-select bit line voltage supply circuit USBVS is arranged at the other end of the bit lines BL0 to BLn respectively.

Figure 15:
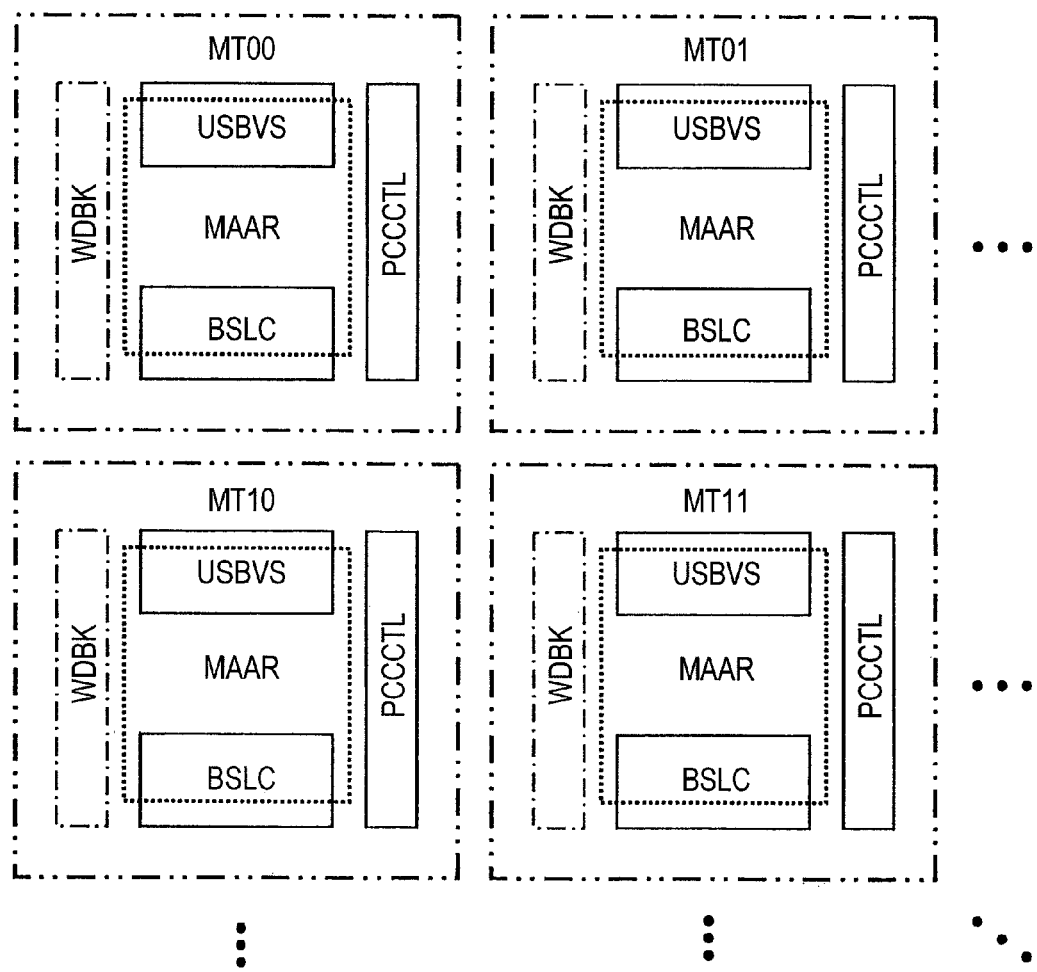
FIG. 15 is a view schematically showing an example of an arrangement for the various driving circuits in the memory tile shown in FIG. 13.

FIG. 15 schematically shows an arrangement of the driving circuits described above. By arranging various driving circuits each at the periphery of the memory cell array region MAAR, interconnects above each of the driving circuits are eliminated. As a result, connection between the various driving circuits and global interconnects such as global word lines or global bit lines and the power source interconnect is facilitated. That is, the area for the various driving circuits can be decreased.

Figure 16:
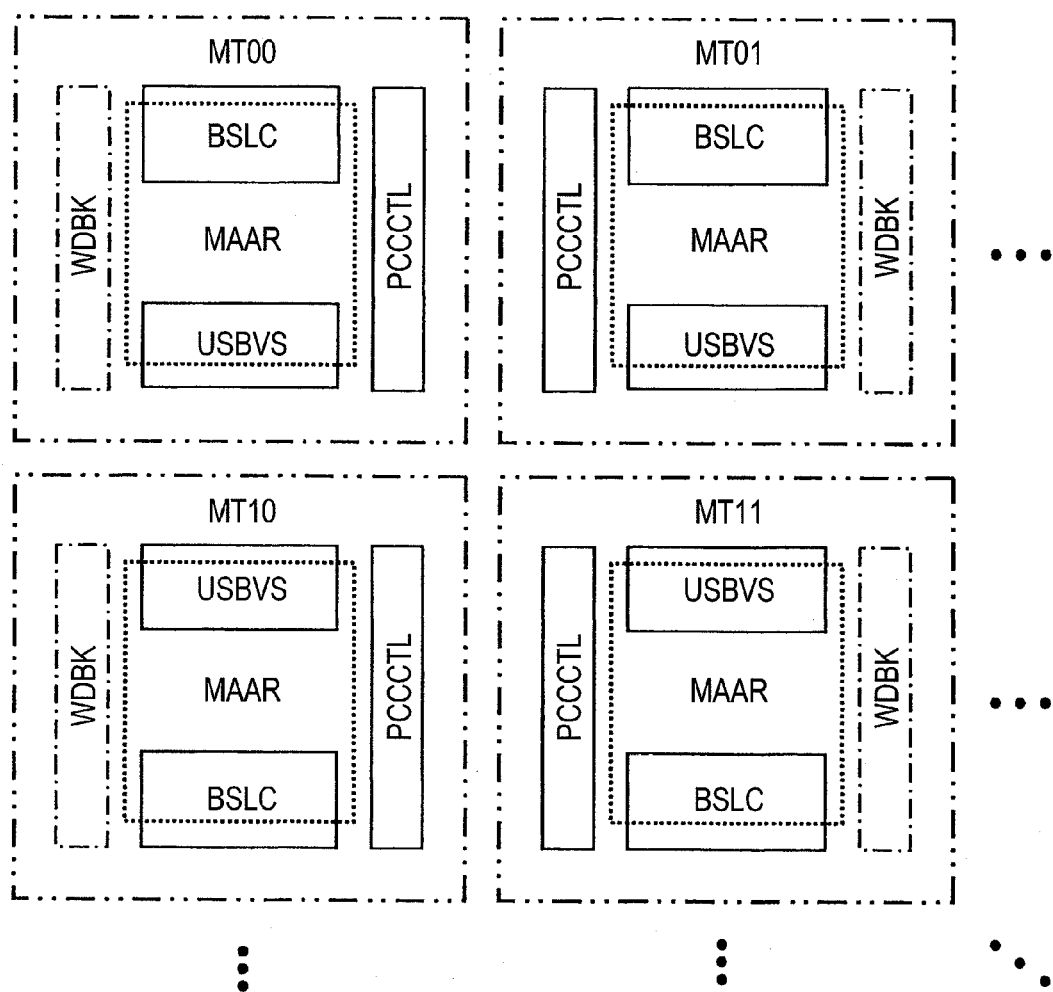
FIG. 16 is a view schematically showing an example of an arrangement for the memory tile shown in FIG. 13.

FIG. 16 shows another example for the arrangement of the driving circuits. This is different from the arrangement shown in FIG. 15 in that each of the memory tiles is arranged in such a direction that identical type driving circuits are in contact with each other. The layout area can be decreased with such an arrangement by using contacts for connection with common control lines or power source lines in common. Further, by forming respective driving circuits in a common well, a well isolation region can be eliminated and, as a result, the area for the various driving circuits can be decreased.

Fifth Embodiment

Figure 17:
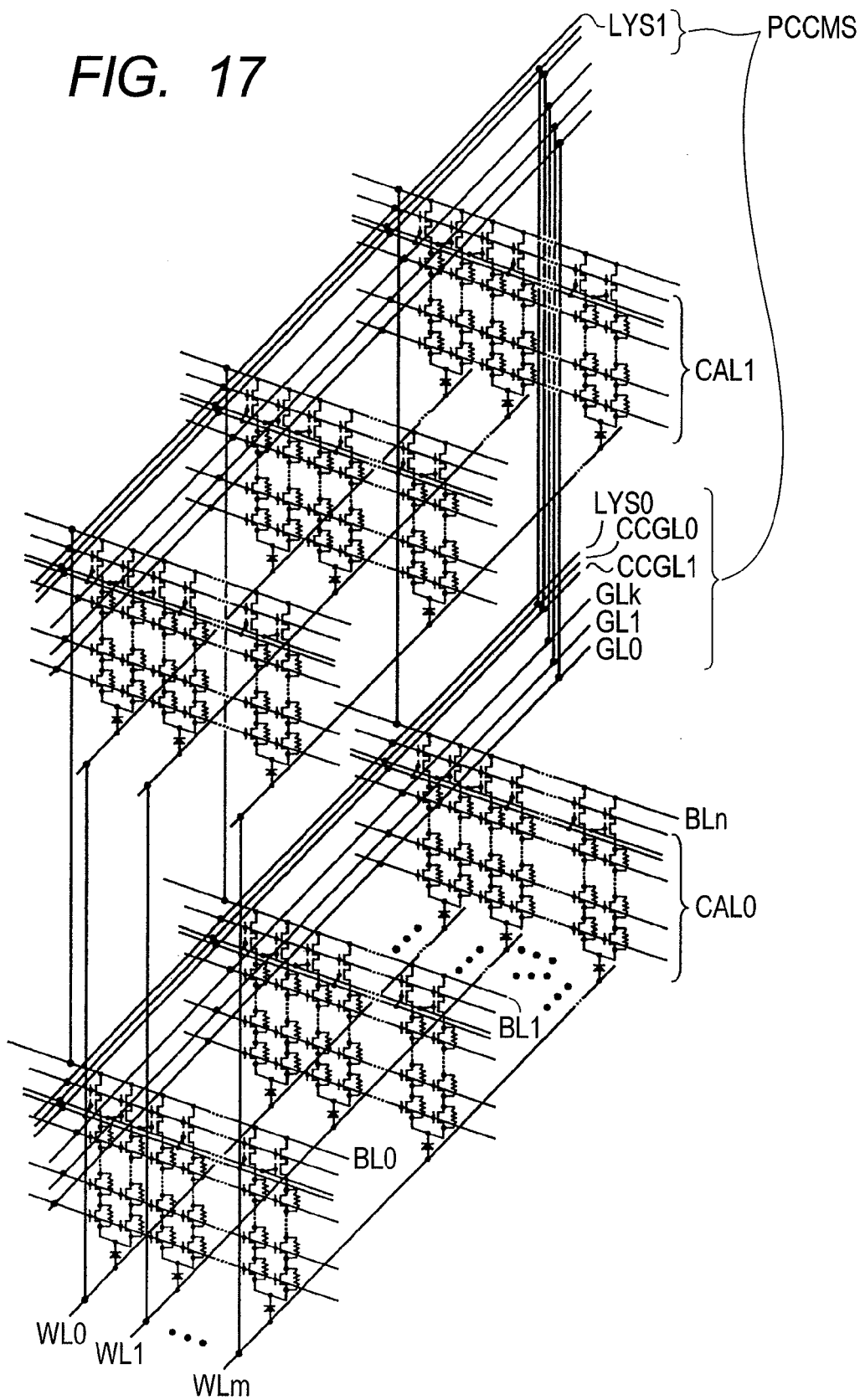
FIG. 17 is a view showing a configurational example of a memory cell array circuit of a phase change memory in a semiconductor device according to a fifth embodiment of the invention.

In this embodiment, a still further configuration of a memory cell array of the phase change memory is to be described. FIG. 17 shows a memory cell array configuration in this embodiment. When compared with the memory cell array configuration shown in FIG. 11, this embodiment has the following two features. The first feature is that two memory cell arrays CAL0 to CAL1 are stacked. The second feature is that the memory cell arrays CAL0 to CAL1 described above are connected to common word lines WL0 to WLm and common bit lines BL0 to BLn.

Figure 18:
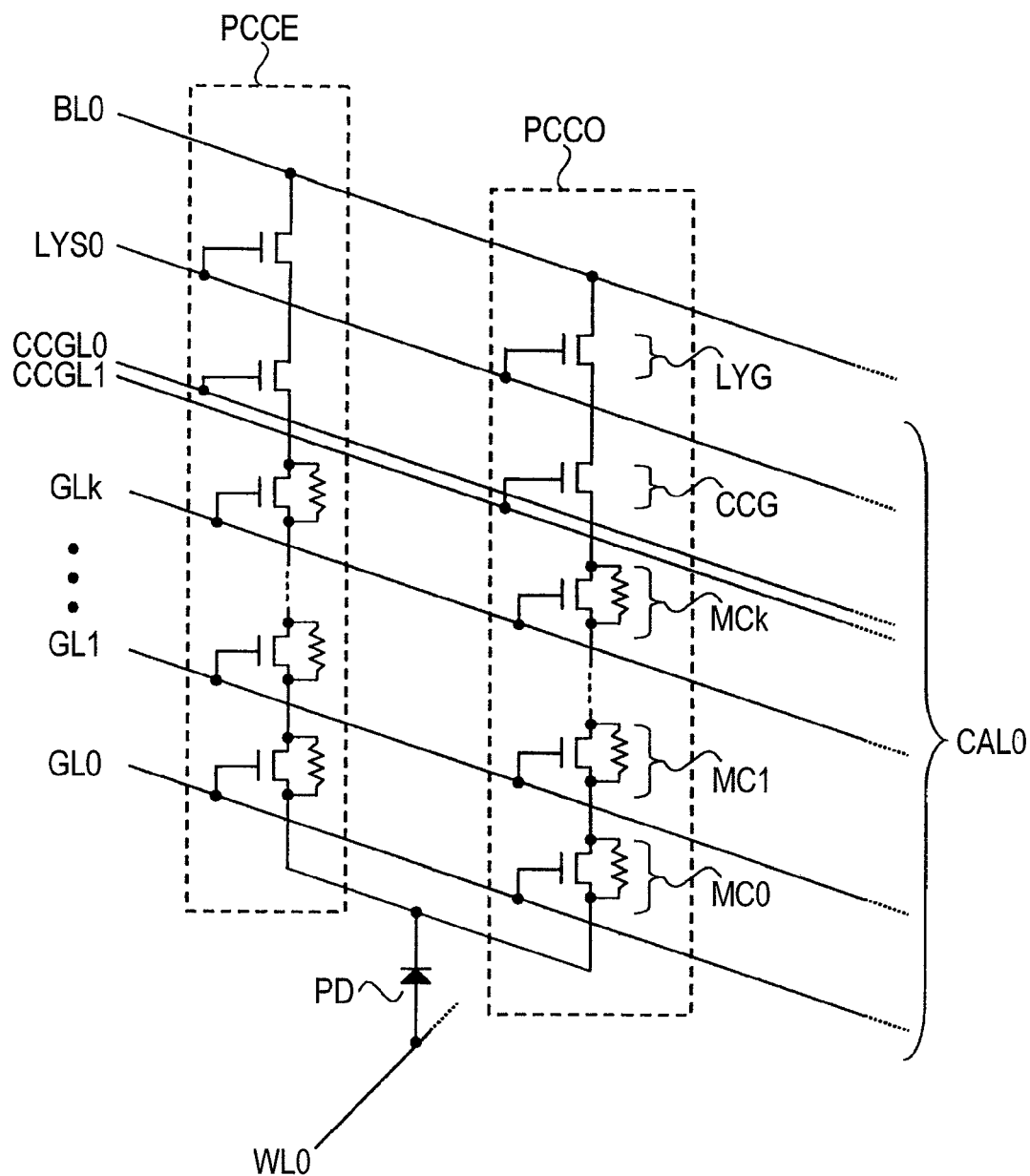
FIG. 18 is a view showing an example of a configuration of a phase-change-type string circuit in a memory cell array in the phase change memory shown in FIG. 17.

FIG. 18 shows a circuit configuration of phase-change-type string formed at the intersection between the word line WL0 and the bit line BL0 in the memory cell array CAL0 at the first layer shown in FIG. 17. Like the circuit configuration shown in FIG. 3, two phase-change-chain cells PCCE and PCC0 in parallel with each other are connected in series with a polysilicon diode PD connected to a word line WL0. However, this embodiment is different in that a layer select gate LYG is interposed between the chain cell select gate CCG and the bit line in each of the phase-change-type chain cells PCCE and PCC0. The structure of the phase-selection gate LYG is identical with the chain cell selection gate CCG. All of the layer select gates LYG of the phase-change-type chain cell in the memory cell array CAL0 at the first layer are connected to the layer select signal LYS0. On the other hand, all of the layer select gates LYG of the phase-change-type chain cell in the memory cell array CAL1 at the second layer are connected to the layer select signal LYS1. The layer select signals LYS0 to LYS1 are constituent elements of the phase-change-type chain cell control signal group PCCMS shown in FIG. 17. In FIG. 18, while arrangement for various driving circuits is not illustrated, the arrangement of the memory tile shown in FIG. 16 is preferred. Since, various driving circuits are arranged individually at the periphery of the memory cell array, connection with the word lines and the bit lines in the memory cell array at the second layer is facilitated.

Figure 19:
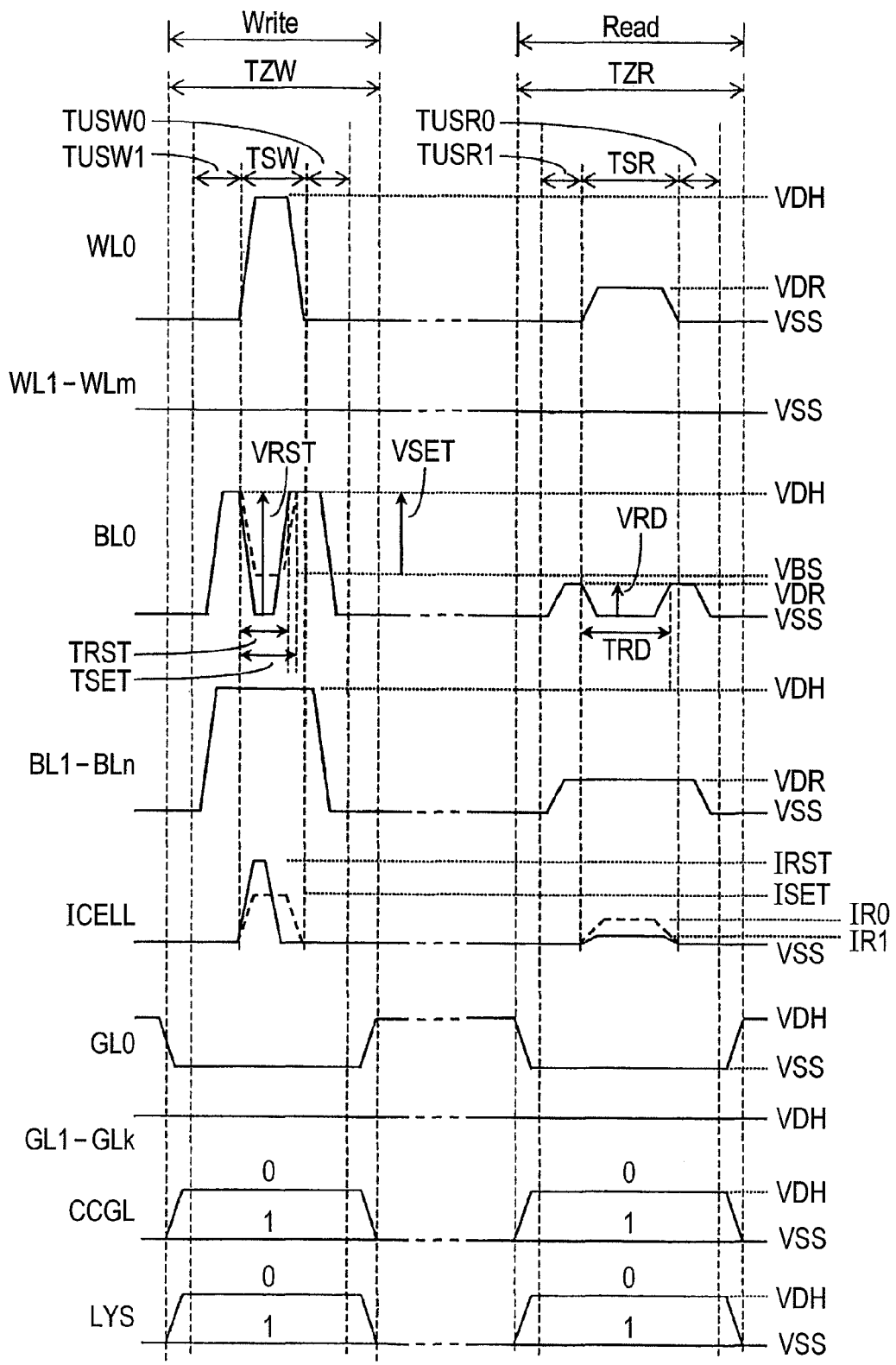
FIG. 19 is a view showing an example of an operation timing chart of the memory cell array in the phase change memory shown in FIG. 17.

FIG. 19 shows the rewrite operation and the read operation in the memory cell array CAL0 at the first layer shown in FIG. 17. The difference from the operations shown in FIG. 9 is that a timing chart for the layer select gate LYG is added. The layer select gate LYG is controlled together with the chain cell select gate lines CCGL0 to CCGL1 and the gate lines GL0 to GLk during Z selecting operation. That is, when the Z selecting operation is started, a layer select signal LYS0 among the layer select signals LYS0 to LYS1 at the ground voltage VSS is driven to an elevated voltage VDH. By the operation, all of the layer select gates LYG of the phase-change-type strings in the memory cell array CAL0 at the first layer is put to a conduction state.

With the constitution and the operation described above, the following three advantageous effects are obtained. The first effect is that more memory cells can be formed per unit area by stacking the phase-change-type strings. This effect enables to attain a low cost phase change memory. The second effect is that the selecting operation can be performed with a smaller number of control lines by connecting the stacked phase-change-type strings to a common control lines. This effect can decrease the number of various driving circuits and, further, can provide a phase change memory of further reduced cost. The third effect is that relevant driving circuits and the control line constituting the memory cell arrays CAL0 to CAL1 can be connected at substantially identical positions by arranging various driving circuits to positions opposed each other sandwiching the memory cell array therebetween. That is, a phase change memory of a further reduced cost can be attained by connecting memory cell arrays CAL0 to CAL1 at a small area.

Sixth Embodiment

Figure 20:
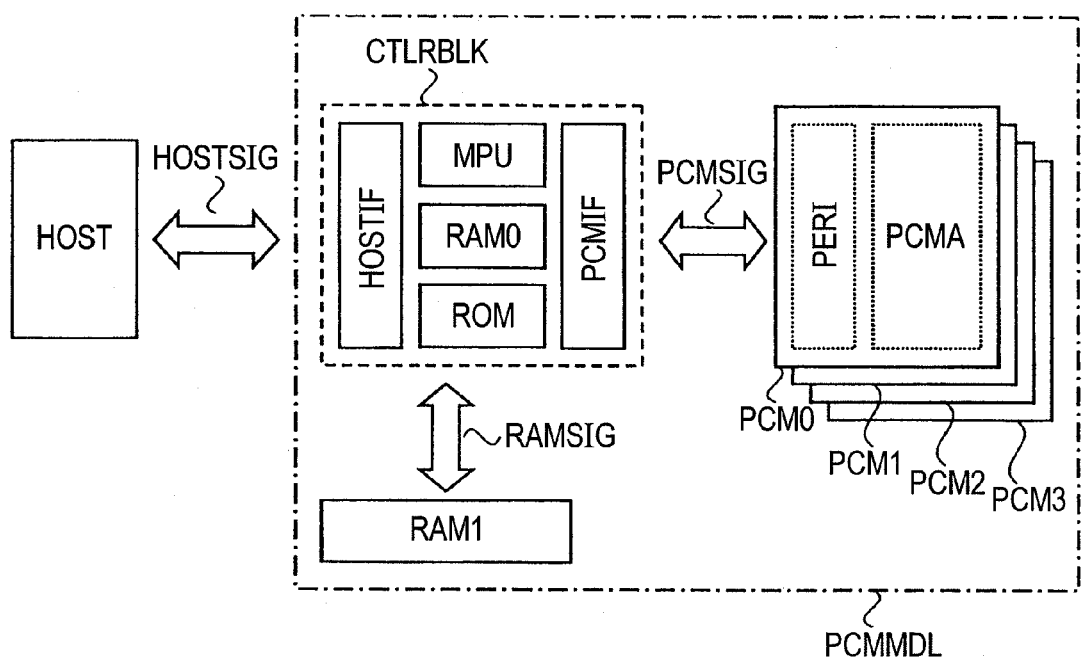
FIG. 20 is a view showing a configurational example of a memory module to which a cell array of a phase change memory according to a sixth embodiment of the invention is applied.

In this embodiment, a configurational example of a memory module to which the cell array of the phase change memory explained previously for the first to fifth embodiments is applied is to be described with reference to FIG. 20. This memory module PCMMDL includes phase change memories PCM0 to PCM3, external random access memory RAM1, and a controller block CTLRBLK. Each of the phase-change memories PCM0 to PCM3 includes a phase change memory array PCMA and peripheral circuit PERI. The phase change memory array PCMA has a circuit configuration, for example, shown in FIG. 1, FIG. 11, and FIG. 13. The peripheral circuit PERI has an input/output circuit for sending and receiving commands, an address decoder circuit, a power source circuit, etc.

The external random access memory RAM 1 is SRAM (Static Random Access Memory) or DRAM (Dynamic Random Access Memory). The controller block CTLRBLK includes a micro processor unit MPU, a random access memory RAM0, a read only memory ROM, a phase change memory interface PCMIF, and a host instrument interface HOSTIF. The random access memory RAM0 is SRAM or DRAM. The external random access memory RAM1 and the random access memory RAM0 temporarily hold stored information read out from the phase change memory PCM and information to be written newly to the phase change memory PCM. Programs such as wear leveling and error correction are stored in the read only memory ROM. The microprocessor unit MPU reads the programs and executes wear leveling. Each of the units of the controller block CTLRBLK is connected from the phase change memory interface PCMIF by way of the phage change memory signal group PCMSIG to the phase change memory PCM. Further, they are connected by way of the RAM signal group RAMSIG to the external random access memory RAM1. Further, they are connected from the host instrument interface HOSTIF by way of the host equipment signal group HOSTSIG to a hose equipment HOST. With the constitutions and the functions described above, a memory module of large capacity and high reliability can be obtained.

While the invention made by the present inventors has been described specifically with reference to the preferred embodiments, it will be apparent that the present invention is not restricted to the embodiments described above but can be modified variously within a range not departing from the gist of the invention. The present invention is applicable not only to a single memory chip but also to an on chip memory.

In the phase change memory as the constituent element of the semiconductor device according to the present invention, a bottom area necessary for forming one memory cell can be decreased by forming the memory cell on the side wall of the connection hole. The bottom area can be decreased further by stacking memory cells. Further, by using control signals for selecting the memory cell in common for multiple memory cells, the number of control lines can be decreased and the number of driving circuits arranged on every control line, that is, the area of the driving circuits can be suppressed. Further, by arranging driving circuits of high symmetricity that are connected to control signal interconnects formed at a pitch twice as large as the minimum of feature size F adjacent to the memory cell array region, highly efficient layout arrangement can be obtained. The present invention is suitable to obtain a semiconductor device of high integration degree and large capacity by using the phase change memory having such synergistic effects.

What is claimed is:
1. A semiconductor device comprising:
   a respective plurality of memory cell groups arranged at each of a plurality of intersections between a plurality of word lines and a plurality of bit lines intersecting the word lines,
   wherein each of the memory cell groups includes first and second memory cells connected in series,
   wherein each of the first and second memory cells includes a select transistor and a resistive storage device,
   wherein the select transistor and the resistive storage device are connected in parallel,
   wherein a gate electrode of the select transistor in the first memory cell is connected to a first gate line,
   wherein a gate electrode of the select transistor in the second memory cell is connected to a second gate line,
   wherein a first circuit block for driving the word lines, a second circuit block for driving the first and second gate lines, and the plurality of memory cell groups are arranged in line with extending direction of the word lines, and wherein the first circuit block is arranged between the second circuit block and the plurality of memory cell groups.

2. The semiconductor device according to claim 1,
wherein the first gate lines are short-circuited to each other, and
wherein the second gate lines are short-circuited to each other.

3. The semiconductor device according to claim 1, wherein the plurality of word lines are formed at a pitch twice as large as a minimum feature size F.

4. The semiconductor device according to claim 1, wherein the resistive storage device is formed of a chalcogenide material.

5. The semiconductor device according to claim 1,
wherein the first and second gate lines are arranged over the first circuit block.

6. A semiconductor device comprising:
a respective plurality of memory cell groups arranged at each of a plurality of intersections between a plurality of word lines and a plurality of bit lines intersecting the word lines,
wherein each of the memory cell groups includes first and second memory cells connected in series,
wherein each of the first and second memory cells includes a select transistor and a resistive storage device,
wherein the select transistor and the resistive storage device are connected in parallel,
wherein a gate electrode of the select transistor in the first memory cell is connected to a first gate line,
wherein a gate electrode of the select transistor in the second memory cell is connected to a second gate line,
wherein a first circuit block for driving the word lines is arranged between a second circuit block for driving the first and second gate lines and the plurality of memory cell groups,
wherein each memory cell group further includes a chain select transistor connected in series with the first and second memory cells,
wherein the semiconductor device further comprises a plurality of chain select gate lines connected to respective gates of the chain select transistors,
wherein even numbered chain select gate lines in a plan view are short-circuited to each other, and
wherein odd numbered chain select gate lines in the plan view are short-circuited to each other.

7. The semiconductor device according to claim 6,
wherein the number of odd numbered chain select gate lines is greater by one than the number of even numbered chain select gate lines, and
wherein two outermost chain select gate lines are odd numbered chain select gate lines.

8. A semiconductor device comprising:
a respective memory tile arranged at each of a plurality of intersections between a plurality of global word lines and a plurality of global bit lines intersecting the global word lines,
wherein each memory tile includes a respective plurality of memory cell groups arranged at each of a plurality of intersections between a plurality of word lines and a plurality of bit lines intersecting the word lines,
wherein for each memory tile is provided a corresponding group of global word lines,
wherein the number of the word lines for each memory tile is the same as the number of global word lines of the corresponding group of global word lines, and
wherein each memory cell group includes a first memory cell and a second memory cell.

9. The semiconductor device according to claim 8,
wherein each memory tile further includes a first circuit block driving the plurality of word lines, and
wherein the first circuit block is arranged at a periphery of the plurality of memory cell groups.

10. The semiconductor device according to claim 9, wherein each memory tile is arranged such that the first circuit blocks of the memory tiles are in contact with each other.

* * * * *